United States Patent

Nagasawa et al.

[11] Patent Number: 5,945,883
[45] Date of Patent: Aug. 31, 1999

[54] VOLTAGE CONTROLLED RING OSCILLATOR STABILIZED AGAINST SUPPLY VOLTAGE FLUCTUATIONS

[75] Inventors: Hideaki Nagasawa; Atsuhiko Ishibashi, both of Tokyo, Japan

[73] Assignee: Mitsubishi Denki Kabushiki Kaisha, Tokyo, Japan

[21] Appl. No.: 08/986,323

[22] Filed: Dec. 5, 1997

Related U.S. Application Data

[63] Continuation-in-part of application No. 08/769,801, Dec. 20, 1996, Pat. No. 5,764,110.

[30] Foreign Application Priority Data

Jul. 15, 1996 [JP] Japan .................................. 8-184800
May 28, 1997 [JP] Japan .................................. 9-138210

[51] Int. Cl.$^6$ .................................................. H03B 5/04
[52] U.S. Cl. ........................ 331/57; 331/177 R; 331/183
[58] Field of Search ................................ 331/57, 177 R, 331/183

[56] References Cited

U.S. PATENT DOCUMENTS 5,075,640 12/1991 Miyazawa ................................. 331/10
5,410,278 4/1995 Itoh et al. ................................. 331/57

FOREIGN PATENT DOCUMENTS 4-296113 10/1992 Japan .
6-21776 1/1994 Japan .
6-61801 3/1994 Japan .

Primary Examiner—Siegfried H. Grimm
Attorney, Agent, or Firm—Oblon, Spivak, McClelland, Maier & Neustadt, P.C.

[57] ABSTRACT

A circuit for suppressing period jitter of the clock output of a ring oscillator caused by supply voltage fluctuations. The ring oscillator includes n identical current controlled delay circuits 26.1-n connected in a ring, and a replica circuit 36 identical to the current controlled delay circuit. The replica circuit 36 receives a constant input voltage so that its output is always at a high level. A differential amplifier 35 receiving a reference potential Vref is connected in a negative feedback circuit with replica circuit 36, so that the output of the replica circuit 36 is held equal to the reference potential Vref. An output of the negative feedback circuit is also applied to each of the current controlled delay circuits 26.1-n, so that their high level outputs are held equal to the reference potential Vref.

16 Claims, 27 Drawing Sheets

F I G. 2 0
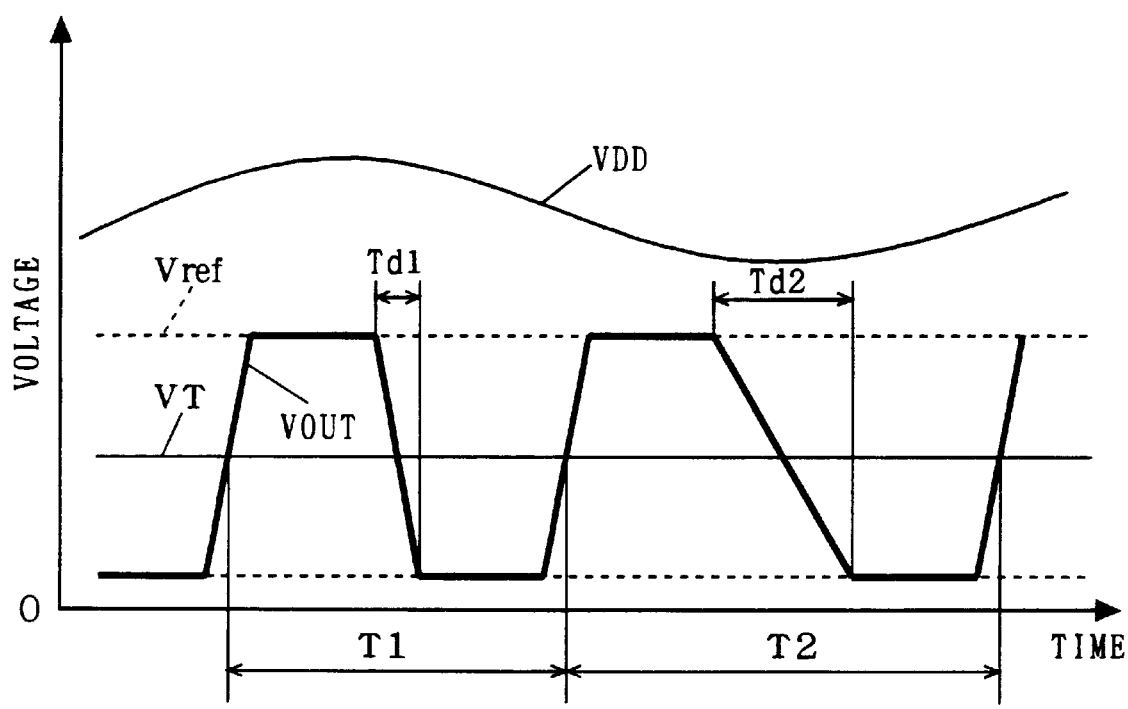

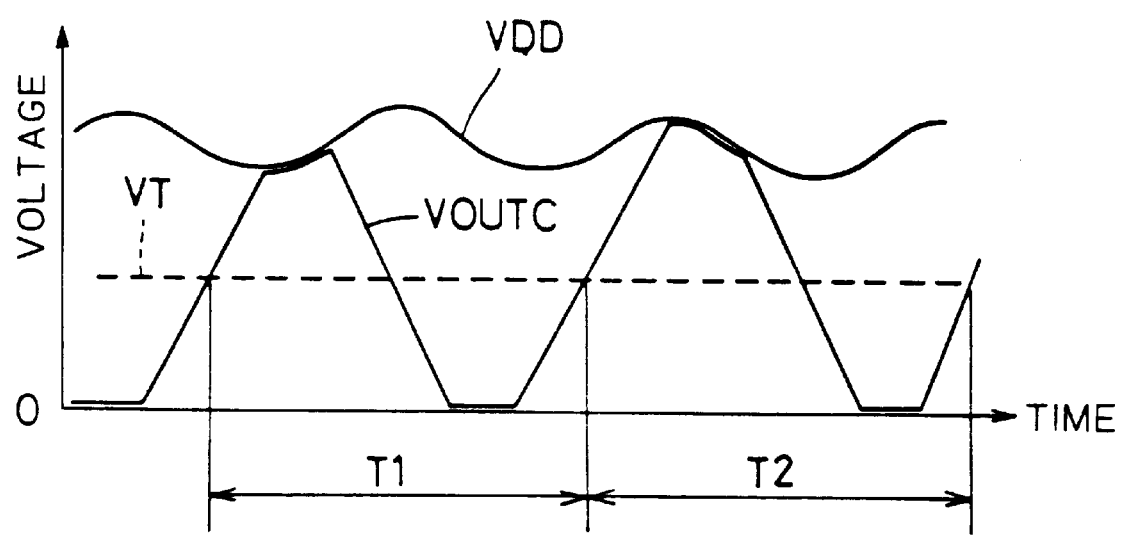
F I G. 30

5,945,883

VOLTAGE CONTROLLED RING OSCILLATOR STABILIZED AGAINST SUPPLY VOLTAGE FLUCTUATIONS

This application is a Continuation-in-part (CIP) of application Ser. No. 08/769,801, filed on Dec. 20, 1996 and now U.S. Pat. No. 5,764,110.

BACKGROUND OF THE INVENTION

1. Field of the Invention

The present invention relates to a voltage controlled ring oscillator suitable for the application to a PLL circuit, and more particularly to improvement for suppressing the influence of the fluctuation of a source voltage on the cycle (period) of an output clock signal.

2. Description of the Background Art

FIG. 29 is a circuit diagram showing the structure of a voltage controlled ring oscillator (VCO) according to the prior art which has been published in U.S. Pat. No. 5,075,640 which is the background of the present invention. As shown in FIG. 29, a VCO 151 comprises current controlled delay circuits 26.1 to n (n is an odd number) and a current control circuit 121.

A PMOS 21.k, a PMOS 22.k, an NMOS 24.k and an NMOS 25.k included in a current control delay circuit 26.k (k=1 to n) are sequentially connected, in series, from a high potential side power line 11 to a ground side power line 12. The gate electrode of the PMOS 22.k is connected to that of the NMOS 24.k so that the PMOS 22.k and the NMOS 24.k form an inverter 20.k. Inverters 20.1 to n are cascade-connected cyclically (annularly) in such a manner that the output of a stage is connected to the input of the next stage.

The current control circuit 121 includes PMOSs 27 and 28 and NMOSs 29 and 30. An input terminal 13 for inputting an input voltage signal VIN is connected to the gate electrode of the NMOS 30. A current having a magnitude which is proportional to the magnitude of the input voltage signal VIN flows in the NMOS 30.

The PMOS 28 whose gate and drain electrodes are short-circuited is connected to the NMOS 30 in series. Furthermore, the PMOS 28, the PMOS 27 and PMOSs 21.1 to n form a current mirror circuit. For this reason, a current having a magnitude which is proportional to that of the current flowing in the NMOS 30 flows in the PMOS 27 and the PMOSs 21.1 to n.

The NMOS 29 whose gate and drain electrodes are short-circuited is connected to the PMOS 27 in series. Furthermore, the NMOS 29 and NMOSs 25.1 to n form a current mirror circuit. For this reason, a current having a magnitude which is proportional to that of the current flowing in the NMOS 30 also flows in the NMOSs 25.1 to n. Thus, the current control circuit 121 serves to control the PMOSs 21.1 to n and the NMOSs 25.1 to n so as to cause a current having a magnitude which is proportional to the magnitude of the input voltage signal VIN to flow. The PMOSs 21.1 to n and the NMOSs 25.1 to n function as current sources for the inverters 20.1 to n.

When signals having the low and high levels are inputted, each of the inverters 20.1 to n outputs signals having the inverted levels after a delay time. The delay time in which the output rises from the low level to the high level is inversely proportional to the magnitude of the current which flows in the PMOSs 21.1 to n. The delay time in which the output falls from the high level to the low level is inversely proportional to the magnitude of the current which flows in the NMOSs 25.1 to n.

The number of the inverters 20.1 to n is odd. In addition, the inverters 20.1 to n are connected like a ring. For this reason, the low level and the high level are alternately propagated every stage to perform oscillation. Furthermore, the cycle (or period) of the oscillation is the total of the delay values of the inverters 20.1 to n. In particular, if the delay values of rise and fall are equal to each other, the cycle of the oscillation is 2 n times as much as each delay value.

More specifically, the inverters 20.1 to n oscillate at a frequency which is proportional to the input voltage signal VIN. The output of the current controlled delay circuit 26.n which oscillates is fetched as a clock signal VOUTC to the outside through an output terminal 14 connected to the current controlled delay circuit 26.n.

The VCO 151 according to the prior art has the above-mentioned structure. Therefore, there is a problem that the delay times of the inverters 20.1 to n are greatly influenced by the potential of the high potential side power line 11, that is, a potential difference between the high potential side power line 11 and the ground side power line 12. FIG. 30 is a graph typically showing the waveform of the clock signal VOUTC to explain the above-mentioned problem.

Each of the PMOSs 21.1 to n and the NMOSs 25.1 to n which belong to the current controlled delay circuits 26.1 to n merely changes the amount of a drain-source current (main current) thereof according to the value of the input voltage signal VIN. For this reason, the potential of an output of each of the inverters 20.1 to n transits between the potential of the ground side power line 12 and a potential VDD of the high potential side power line 11 as shown in FIG. 30. Consequently, the delay time of each of the inverters 20.1 to n is varied under the influence of the potential VDD of the high potential side power line 11.

As a result, the straight line of a threshold voltage VT which is a reference value to distinguish the clock signal VOUTC into the high and low levels and the curve of the clock signal VOUTC do not always intersect at regular time intervals but the cycle of intersection fluctuates. In other words, the VCO 151 has had a problem that the fluctuation of the cycle is caused to the clock signal VOUTC by the fluctuation of the potential VDD, that is, a period jitter appears. In an example of FIG. 30, a cycle T1 and a cycle T2 have the relationship of T1<T2. It has been known that the period jitter appears especially remarkably when the cycle of the fluctuation of the potential VDD approximates the cycle of the clock signal VOUTC.

SUMMARY OF THE INVENTION

The present invention relates to a voltage controlled ring oscillator in which the frequency of an output signal is variable according to an input voltage signal.

A first aspect of the present invention is directed to a voltage controlled oscillator, comprising first to nth (n is an odd number) inverters which are cascade-connected cyclically and have the same structures, an (n+1)th inverter which has the same structure as that of each of the first to nth inverters and has an input connected to one of power lines, and first to (n+1)th current sources which have the same structures, are provided between the other power line and power input ends of the first to (n+1)th inverters respectively, and supply, to the first to (n+1)th inverters respectively, a current having a magnitude which corresponds to a control signal.

Furthermore, the voltage controlled oscillator comprises a current control circuit for supplying the control signal to the first to (n+1)th current sources according to the input voltage signal, and first to (n+1)th bypass circuits which have the same structures, are provided between the respective power input ends of the first to (n+1)th inverters and one of the power lines, and are conducted to bypass currents of the first to (n+1)th current sources.

In addition, the voltage controlled oscillator comprises a bypass control circuit which holds a potential difference between an output of the (n+1)th inverter and one of the power lines to have a predetermined value which is set smaller than a voltage between one of the power lines and the other power line by making the first to (n+1)th bypass circuits conductive when the potential difference exceeds the predetermined value.

A second aspect of the present invention is directed to the voltage controlled oscillator according to the first aspect of the present invention, wherein the bypass control circuit includes a differential amplifier, and wherein each of the first to (n+1)th bypass circuits includes a switching element which is turned on and off in response to an output of the differential amplifier, the differential amplifier serving to amplify a difference between the output of the (n+1)th inverter and a reference potential having a constant magnitude for one of the power lines.

A third aspect of the present invention is directed to the voltage controlled oscillator according to the first aspect of the present invention, wherein the bypass control circuit includes a differential amplifier, and wherein each of the first to (n+1)th bypass circuits includes a switching element which is turned on and off in response to an output of the differential amplifier, the differential amplifier serving to amplify a difference between the potential of the power input end of the (n+1)th inverter and a reference potential having a constant magnitude for one of the power lines.

A fourth aspect of the present invention is directed to the voltage controlled oscillator according to the second or third aspect of the present invention, wherein the switching element is a transistor element, each of the first to (n+1)th bypass circuits including another transistor element which is connected to the transistor element in series, and a driving portion for turning on the another transistor element when an output of corresponding one of the first to (n+1)th inverters exceeds a value with which the transistor is turned on and further approaches the predetermined value.

A fifth aspect of the present invention is directed to the voltage controlled oscillator according to any of the second to fourth aspects of the present invention, further comprising a driving circuit which is provided between the differential amplifier and the switching elements included by the first to (n+1)th bypass circuits, and amplifies a current outputted by the amplifier.

A sixth aspect of the present invention is directed to the voltage controlled oscillator according to the fifth aspect of the present invention, wherein the driving circuit includes a pair of transistors which are complementary to each other and connected to each other in series, and are provided between one of the power lines and the other power line, and wherein the output of the differential amplifier is inputted to a control electrode of one of the pair of transistors in such a manner that one of the pair of transistors is turned off when the potential difference exceeds the predetermined value, a control electrode of the other of the pair of transistors is connected to one of the power lines or the other power line in such a manner that the other of the pair of transistors is always turned on, and a connecting portion of the pair of transistors is connected to the switching element.

A seventh aspect of the present invention is directed to the voltage controlled oscillator according to any of the first to sixth aspects of the present invention, referring to the first to (n+1)th inverters as a first group thereof, further comprising a second group of first to (n+1)th inverters which have the same structures as those belonging to the first group.

Furthermore, the first to nth inverters belonging to the second group are cyclically cascade-connected to one another independently of the first to (n+1)th inverters belonging to the first group, the first to (n+1)th current sources are connected to the first to (n+1)th inverters which belong to the first group and the first to (n+1)th inverters which belong to the second group, respectively, and the predetermined value is inputted to an input of the (n+1)th inverter which belongs to the second group.

An eighth aspect of the present invention is directed to the voltage controlled oscillator according to any of the first to sixth aspects of the present invention, referring to the first to (n+1)th current sources as a first group and referring to the control signal as a first control signal, further comprising a second group of first to (n+1)th current sources which have the same structures, are provided between one of the power lines and other power input ends of the first to (n+1)th inverters respectively, and supply a current having a magnitude that corresponds to a second control signal.

Furthermore, the current control circuit supplies the first and second control signals to the first and second groups of current sources in response to the input voltage signal in such a manner that the magnitudes of currents supplied from the first and second groups of current sources are equal to each other.

A ninth aspect of the present invention is directed to the voltage controlled oscillator according to any of the first to sixths aspects of the present invention, wherein one of the power lines and the other power input ends of the first to (n+1)th inverters are connected to each other in such a manner that a source current ratio of a magnitude of a current flowing therein to a magnitude of a current supplied from each of the first to (n+1)th current sources exceeds a value "1".

A tenth aspect of the present invention is directed to the voltage controlled oscillator according to the ninth aspect of the present invention, referring to the first to (n+1)th current sources as a first group and referring to the control signal as a first control signal, further comprising a second group of first to (n+1)th current sources which have the same structures, are provided between one of the power lines and the other power input ends of the first to (n+1)th inverters respectively, and supply a current having a magnitude that corresponds to a second control signal.

The current control circuit supplies the first and second control signals respectively to the first and second groups of current sources in response to the input voltage signal in such a manner that the magnitudes of currents supplied from the second group of current sources are greater than those of currents supplied from the first group of current sources.

An eleventh aspect of the present invention is directed to the voltage controlled oscillator according to the tenth aspect of the present invention, wherein each of the first to (n+1)th current sources which belong to the first group includes a first MOS transistor element for receiving the first control signal at a gate electrode, each of the first to (n+1)th current sources which belong to the second group includes a second MOS transistor element for receiving the second control signal at a gate electrode, and a channel width of the second MOS transistor element is set greater than a channel width equivalent in current to the first MOS transistor element.

A twelfth aspect of the present invention is directed to the voltage controlled oscillator according to the tenth aspect of the present invention, wherein each of the first to (n+1)th current sources which belong to the first group includes a first MOS transistor element for receiving the first control signal at a gate electrode, and each of the first to (n+1)th current sources which belong to the second group includes a second MOS transistor element for receiving the second control signal at a gate electrode.

The second MOS transistor element includes a plurality of third MOS transistor elements having gate electrodes, drain electrodes and source electrodes connected to one another, and a channel width of each of the third MOS transistor elements is set equal to a channel width equivalent in current to the first MOS transistor.

A thirteenth aspect of the present invention is directed to the voltage controlled oscillator according to the ninth aspect of the present invention, wherein one of the power lines and the other power input ends of the first to (n+1)th inverters are connected to each other through a resistive element.

A fourteenth aspect of the present invention is directed to the voltage controlled oscillator according to the ninth aspect of the present invention, wherein one of the power lines and the other power input ends of the first to (n+1)th inverters are short-circuited.

A fifteenth aspect of the present invention is directed to the voltage controlled oscillator according to any of the ninth to fourteenth aspects of the present invention, wherein the source current ratio is set within a range in which an output of each of the first to (n+1)th inverters can reach a level on a potential side of the other power line.

A sixteenth aspect of the present invention is directed to the voltage controlled oscillator according to the fifteenth aspect of the present invention, wherein the source current ratio b is set within a range in which a relationship of $Tmax \leq (k+1)Vt/\theta + kaVt/(b\ \theta)$ is established for a transition time Tmax and a transition speed $\theta$ taken during a transition of an output of each of the first to (n+1)th inverters from a first level on a potential side of one of the power lines to a second level on a potential side of the other power line, a potential difference Vt between a threshold voltage of each of the first to (n+1)th inverters and the first level, a potential difference aVt between the threshold voltage and the second level, the source current ratio b, and a natural number k defined by n=2k+1.

According to the first aspect of the present invention, the input of the (n+1)th inverter is connected to one of the power lines. For this reason, the (n+1)th inverter outputs a second level (for example, the high level) which is different from a first level (for example, the low level) that is a level on a potential side of one of the power lines. By the operation of the bypass control circuit, furthermore, the (n+1)th bypass circuit is conducted when the output of the (n+1)th inverter exceeds a predetermined value so that the current of the (n+1)th current source is bypassed to one of the power lines.

For this reason, the output of the (n+1)th inverter is held to have the predetermined value. The first to (n+1)th inverters have the same structures. Similarly, the first to (n+1)th current sources have the same structures, and the first to (n+1)th bypass circuits have the same structures. Consequently, the values of the second level outputted from the first to nth inverters are also held to have predetermined values.

More specifically, the outputs of the first to nth inverters transit between the potential of one of the power lines and the predetermined value. The predetermined value is set smaller than a voltage between the two power lines, that is, a source voltage. Consequently, even though the source voltage fluctuates a little, the second level values of the outputs of the first to nth inverters which oscillate are not influenced. Consequently, it is possible to suppress the period jitter of the output signal caused by the fluctuation of the source voltage.

According to the second aspect of the present invention, the switching element is turned on and off based on the relationship between the output of the (n+1)th inverter and the reference potential by the operation of the differential amplifier. Consequently, the output of the (n+1)th inverter is held to have a predetermined value. When two inputs to the differential amplifier are coincident with each other, the output is stabilized. For this reason, the predetermined value which is a stationary value of the output of the (n+1)th inverter becomes coincident with the reference potential. Accordingly, the amplitudes of the outputs of the first to nth inverters can directly be set by regulating the reference potential. Furthermore, it is possible to obtain the advantage that the structures of the bypass circuit and the bypass control circuit are simple.

According to the third aspect of the present invention, the switching element is turned on and off based on the relationship between the potential of the power input end of the (n+1)th inverter and the reference potential by the operation of the differential amplifier. Consequently, the output of the (n+1)th inverter is held to have a predetermined value. Since a negative feedback loop for holding the output of the (n+1)th inverter to have the predetermined value does not include the (n+1)th inverter itself, it also follows the fluctuation of the source voltage at a high frequency. For this reason, even though the source voltage fluctuates at the high frequency, the generation of the period jitter can be suppressed. Furthermore, it is possible to obtain the advantage that the structures of the bypass circuit and the bypass control circuit are simple.

According to the fourth aspect of the present invention, the bypass circuit includes another transistor element which is connected, in series, to the transistor element which is provided as the switching element. In addition, another transistor is turned on when respective outputs of the first to (n+1)th inverters exceed the value with which the transistor element is turned on and further approaches the predetermined value by the operation of the driving portion.

Consequently, it is possible to obtain an output signal which is very useful and has the roundness of an edge reduced. Furthermore, it is possible to suppress a variation in the waveform of the output signal caused by the manufacturing error of the threshold voltage of the transistor element forming the bypass circuit. Thus, a waveform having high uniformity can be obtained.

According to the fifth aspect of the present invention, the output of the differential amplifier is transmitted to the switching element of each bypass circuit through the driving circuit for amplifying the current. Consequently, the switching element can be driven at a high speed. Accordingly, the bypass circuit follows the fluctuation of the source voltage at the high frequency so that the generation of the period jitter can be suppressed. When the number n of the inverters which are cascade-connected is greater, the same effect can be produced more remarkably.

According to the sixth aspect of the present invention, the other transistor which is provided in the driving circuit decreases and increases the ON-state resistance respectively when the source voltage is increased and decreased. This is equivalent to the fact that the ON-state resistance of one of the transistors is relatively increased and decreased for the switching element.

Consequently, the switching element is turned on and off respectively. In other words, the other transistor itself brings the negative feedback action. Accordingly, also in the case where the source voltage fluctuates at such a high frequency that the output of the differential amplifier cannot follow, the generation of the period jitter can be suppressed by the negative feedback action of the other transistor.

According to the seventh aspect of the present invention, each of the inverters which belong to the first group and each of the inverters which belong to the second group are connected to each current source in common. The groups are cyclically cascade-connected independently of each other. For this reason, the inverters which belong to the first and second groups that are connected to the common current source oscillate in opposite phases to each other. In addition, the outputs of the inverters which belong to the first and second groups also transit between the potential of one of the power lines and the predetermined value by the operation of the bypass circuit and the bypass control circuit. Thus, it is possible to implement a differential oscillator in which the period jitter caused by the fluctuation of the source voltage is suppressed.

According to the eighth aspect of the present invention, another current source is provided between each inverter and one of the power lines. In addition, this current source is also controlled by the current control circuit so as to supply a current which corresponds to the input voltage signal. For this reason, the delay times in which the output of each inverter rises and falls are changed according to the input voltage signal. Consequently, the sensitivity of the frequency of the output signal to the input voltage signal is high.

According to the ninth aspect of the present invention, the source current ratio is set greater than "1". Therefore, it is possible to suppress a period jitter caused by the fluctuation of the transition time of the output signal as well as the period jitter caused by the fluctuation of the level on the potential side of the other power line of the output signal.

According to the tenth aspect of the present invention, the current source is also provided between each inverter and one of the power lines. In addition, the current corresponding to the input voltage signal is supplied by the operation of the current control circuit. For this reason, both the delay times for the rise and fall of the output of each inverter are changed in response to the input voltage signal. Therefore, the sensitivity of the frequency of the output signal to the input voltage signal is high.

According to the eleventh aspect of the present invention, each of the current sources which belong to the first and second groups is simply formed by the MOS transistor element. Accordingly, the structure of the device is simplified so that a manufacturing cost can be reduced.

According to the twelfth aspect of the present invention, the second MOS transistor element is formed by a parallel circuit of the third MOS transistors each having the channel width equivalent in current to the first MOS transistor. Therefore, precision of the channel width can be increased. In addition, a manufacturing process such as a layout step or the like can easily be performed.

According to the thirteenth aspect of the present invention, one of the power lines and each inverter are connected to each other through the resistive element. Consequently, the source current ratio "b" can easily be set greater than the value "1" by properly selecting the resistance of the resistive element. In addition, the structure of the device can be simplified and the manufacturing cost can be reduced.

According to the fourteenth aspect of the present invention, one of the power lines and each inverter are short-circuited. Therefore, the source current ratio "b" can be set greater than the value "1" with the simplest structure. The structure of the device is the simplest and the manufacturing cost can be reduced.

According to the fifteenth aspect of the present invention, the value of the source current ratio is limited to an optimal range. Therefore, the amplitude of the output signal can have a predetermined magnitude and the effect of suppressing the period jitter can fully be obtained.

According to the sixteenth aspect of the present invention, the value of the source current ratio meets the condition given by the equation. Therefore, the amplitude of the output signal can have a predetermined magnitude and the effect of suppressing the period jitter can fully be obtained.

Thus, it is an object of the present invention to provide a voltage controlled oscillator in which the period jitter of an output clock signal caused by the fluctuation of a source voltage can be suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 20 is a graph typically showing the operation according to the first embodiment of the present invention;

FIG. 30 is a graph for explaining the operation of the VCO according to the prior art.

DESCRIPTION OF THE PREFERRED EMBODIMENTS

<1. First Embodiment>

First of all, a voltage controlled oscillator (VCO) according to a first embodiment will be described below.

<1-1. Structure>

Figure 1:
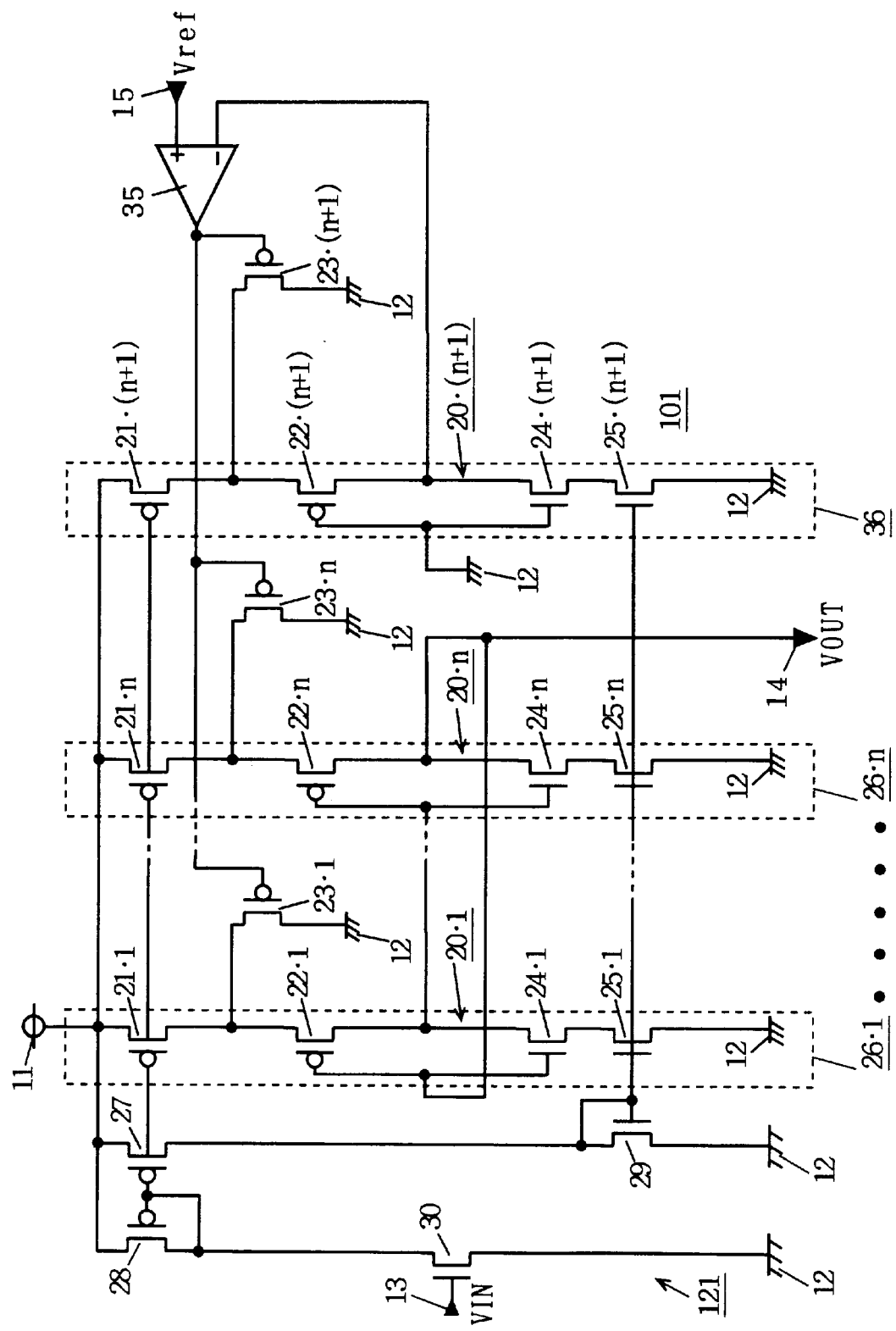
FIG. 1 is a circuit diagram showing a VCO according to a first embodiment of the present invention.

FIG. 1 is a circuit diagram showing the structure of the voltage controlled oscillator (VCO) according to the present embodiment. As shown in FIG. 1, a VCO 101 comprises n current controlled delay circuits 26.1 to n (n is an odd number). The structures of the current controlled delay circuits 26.1 to n are identical to one another.

A current controlled delay circuit 26.k includes PMOSs 21.k and 22.k and NMOSs 24.k and 25.k (k=1 to n in the following description). The drain electrode of the PMOS 22.k is connected to that of the NMOS 24.k. In addition, the gate electrode of the PMOS 22.k is connected to that of the NMOS 24.k. In other words, the PMOS 22.k and the NMOS 24.k form an inverter 20.k.

The drain electrodes which are connected to each other correspond to the output of the inverter 20.k. The gate electrodes which are connected to each other correspond to the input of the inverter 20.k. The PMOS 21.k has a source electrode connected to a high potential side power line 11, and a drain electrode connected to the source electrode of the PMOS 22.k. Similarly, the NMOS 25.k has a source electrode connected to a ground side power line 12, and a drain electrode connected to the source electrode of the NMOS 24.k.

The output of a current controlled delay circuit 26.1, that is, the output of an inverter 20.1 is connected to the input of a current controlled delay circuit 26.2 provided on the next stage, that is, the input of an inverter 20.2 provided on the next stage. Similarly, the output of each stage is connected to the input of the next stage. The output of the current controlled delay circuit 26.n is connected to the input of the current controlled delay circuit 26.1.

Thus, the current controlled delay circuits 26.1 to n are cascade-connected cyclically (annularly). Accordingly, any of the current controlled delay circuits 26.1 to n is equivalent to others. An output terminal 14 is connected to the output of one of the current controlled delay circuits 26.1 to n (the current controlled delay circuit 26.n in an example of FIG. 1). A clock signal VOUT is outputted through the output terminal 14.

The VCO 101 further comprises a replica circuit 36 which has the same structure as that of any of the current controlled delay circuits 26.1 to n. More specifically, the replica circuit 36 includes a PMOS 21.(n+1) having the same structure as that of the PMOS 21.k, a PMOS 22.(n+1) having the same structure as that of the PMOS 22.k, an NMOS 24.(n+1) having the same structure as that of the NMOS 24.k, and an NMOS 25.(n+1) having the same structure as that of the NMOS 25.k.

The drain electrode of the PMOS 22.(n+1) is connected to that of the NMOS 24.(n+1). In addition, the gate electrode of the PMOS 22.(n+1) is connected to that of the NMOS 24.(n+1). In other words, the PMOS 22.(n+1) and the NMOS 24.(n+1) form an inverter 20.(n+1).

The PMOS 21.(n+1) has a source electrode connected to the high potential side power line 11, and a drain electrode connected to the source electrode of the PMOS 22.(n+1). Similarly, the NMOS 25.(n+1) has a source electrode connected to the ground side power line 12, and a drain electrode connected to the source electrode of the NMOS 24.(n+1).

The input of the inverter 20.(n+1) is connected to the ground side power line 12. In other words, the gate electrodes of the PMOS 22.(n+1) and the NMOS 24.(n+1) which are connected to each other are connected to the ground side power line 12. Unlike the current controlled delay circuits 26.1 to n, the potential of the input of the replica circuit 36 is fixed to a ground potential.

The VCO 101 further comprises a differential amplifier 35. The output of the inverter 20.(n+1) is connected to the inversion input of the differential amplifier 35. In other words, the drain electrodes of the PMOS 22.(n+1) and the NMOS 24.(n+1) which are connected to each other are connected to the inversion input of the differential amplifier 35. A reference potential input terminal 15 for inputting a reference potential Vref is connected to the other input of the differential amplifier 35, that is, the non-inversion input thereof.

PMOSs 23.1 to (n+1) are connected to the current controlled delay circuits 26.1 to n and the replica circuit 36, respectively. A PMOS 23.m(m=1 to n+1 in the following description) has a source electrode connected to the ground side power line 12, and a drain electrode connected to the drain electrode of a PMOS 21.m and the source electrode of a PMOS 22.m in common. The output of the differential amplifier 35 is connected to the gate electrodes of the PMOSs 23.1 to (n+1) in common.

Furthermore, a current control circuit 121 including PMOSs 27 and 28 and NMOSs 29 and 30 is connected to the current controlled delay circuits 26.1 to n and the replica circuit 36. In the current control circuit 121, an input terminal 13 for inputting an input voltage signal VIN is connected to the gate electrode of the NMOS 30. The ground side power line 12 is connected to the source electrode of the NMOS 30. The PMOS 28 has a drain electrode connected to the drain electrode of the NMOS 30, and a source electrode connected to the high potential side power line 11. In addition, the gate electrode and the drain electrode of the PMOS 28 are connected to each other.

The ground side power line 12 is connected to the source electrode of the NMOS 29. The PMOS 27 has a drain electrode connected to the drain electrode of the NMOS 29, and a source electrode connected to the high potential side power line 11. The gate electrode and the drain electrode of the NMOS 29 are connected to each other. In addition, the gate electrode of the PMOS 28 is connected to that of the PMOS 27.

More specifically, the current control circuit 121 includes two serial circuits provided between the high potential side power line 11 and the ground side power line 12, that is, a first serial circuit which is formed by the serial connection of the PMOS 28 and the NMOS 30, and a second serial circuit which is formed by the serial connection of the PMOS 27 and the NMOS 29. In addition, the PMOS 28 and the PMOS 27 are connected to form a current mirror circuit.

All the gate electrodes of the PMOSs 21.1 to (n+1), as well as the gate electrode of the PMOS 27, are connected to the gate electrode of the PMOS 28 in common. Similarly, all the gate electrodes of the NMOSs 25.1 to (n+1) are connected to the gate electrode of the NMOS 29 in common. In other words, the PMOS 28, the PMOS 27, and the PMOSs 21.1 to (n+1) form a current mirror circuit. In the same manner, the NMOS 29 and the NMOSs 25.1 to (n+1) form a current mirror circuit. It is preferable that the PMOSs 27 and 28 should have the same structures as those of the PMOSs 21.1 to (n+1) and the NMOS 29 should have the same structure as that of each of the NMOSs 25.1 to (n+1).

Figure 2:
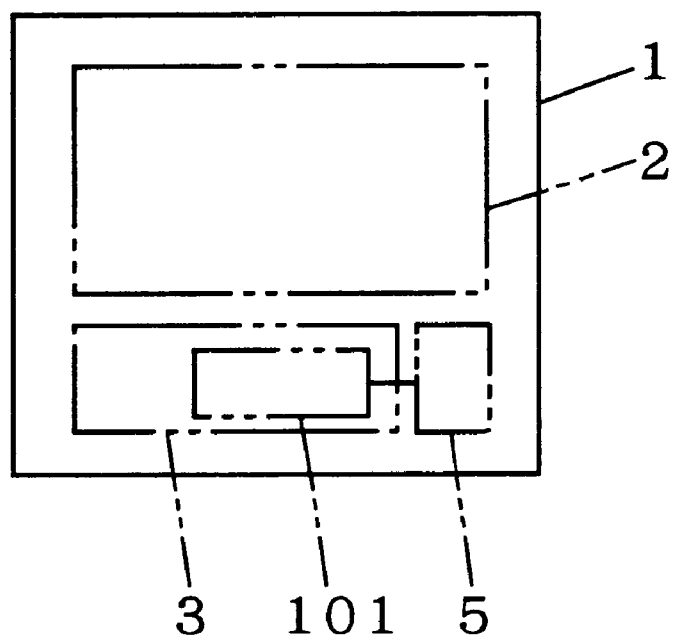
FIG. 2 is a diagram showing the arrangement of a semiconductor chip including the VCO according to the first embodiment of the present invention.

FIG. 2 is a diagram showing the typical form of use of the VCO 101. In an example of FIG. 2, the VCO 101 is built in a semiconductor chip 1 so as to act as the component of a PLL circuit 3. An application circuit 2 which operates by using the PLL circuit 3 is built in the semiconductor chip 1 together with the PLL circuit 3. Furthermore, a reference potential generating portion 5 for supplying the reference potential Vref to the VCO 101 is formed in the semiconductor chip 1.

The form of use of the VCO 101 is not restricted to the form shown in FIG. 2. For example, the reference potential generating portion 5 is not built in the semiconductor chip 1 which is shared with the VCO 101 but the reference potential Vref may be supplied from the outside through a pin connected to the semiconductor chip 1. Moreover, only the VCO 101 may be built in the semiconductor chip 1. In other words, the VCO 101 can be manufactured as an independent semiconductor device.

<1-2. Operation>

The VCO 101 operates in the following manner. With reference to FIG. 1 again, the input voltage signal VIN inputted through the input terminal 13 contributes as the gate voltage of the NMOS 30 (a voltage between the gate electrode and the source electrode). For this reason, the magnitude of a main current which flows in the NMOS 30 (that is, a drain current which flows between the drain electrode and the source electrode) is varied in proportion to the magnitude of the input voltage signal VIN.

The PMOS 28 and the NMOS 30 are connected in series. Consequently, the main current which flows in the NMOS 30 also flows as a main current in the PMOS 28. The gate and drain electrodes of the PMOS 28 are short-circuited. For this reason, a gate voltage which corresponds to the magnitude of the main current that flows in the PMOS 28 is generated between the gate and source electrodes of the PMOS 28.

Since the gate electrode of the PMOS 28 is connected to the gate electrodes of the PMOS 27 and the PMOSs 21.1 to (n+1), the gate voltage of the PMOS 28 is also transmitted to the PMOS 27 and the PMOSs 21.1 to (n+1) as it is. Accordingly, a main current having the magnitude which is proportional to the magnitude of the main current of the PMOS 28 always flows in the PMOS 27 and the PMOSs 21.1 to (n+1).

More specifically, the magnitude of the main current which flows in the PMOS 27 and the PMOSs 21.1 to (n+1) is controlled in proportion to the magnitude of the main current which flows in the PMOS 28 by the effect (the current mirror effect) of the current mirror circuit formed by the PMOS 28, the PMOS 27, and the PMOSs 21.1 to (n+1). In particular, when the structures of the PMOSs 28 and 27 and the PMOSs 21.1 to (n+1) are identical to one another, the main currents whose magnitudes are identical to one another flow therein.

The PMOS 27 and the NMOS 29 are connected in series. Consequently, the main current which flows in the PMOS 27 also flows as a main current in the NMOS 29. The gate and drain electrodes of the NMOS 29 are short-circuited. For this reason, a gate voltage which corresponds to the magnitude of the main current that flows in the PMOS 27 is generated between the gate and source electrodes of the NMOS 29.

Since the gate electrode of the NMOS 29 is connected to the gate electrodes of the NMOSs 25.1 to (n+1), the gate voltage of the NMOS 29 is also transmitted to the NMOSs 25.1 to (n+1) as it is. Accordingly, a main current having the magnitude which is proportional to the magnitude of the main current of the NMOS 29 always flows in the NMOSs 25.1 to (n+1).

More specifically, the magnitude of the main current which flows in the NMOSs 25.1 to (n+1) is controlled in proportion to the magnitude of the main current which flows in the NMOS 29 by the effect of the current mirror circuit formed by the NMOS 29 and the NMOSs 25.1 to (n+1). In particular, when the structures of the NMOS 29 and the NMOSs 25.1 to (n+1) are identical to one another, the main currents whose magnitudes are identical to one another flow therein.

Accordingly, the main current having a magnitude which is proportional to the magnitude of the input voltage signal VIN flows to each of the PMOSs 21.1 to (n+1) and the NMOSs 25.1 to (n+1). More specifically, the PMOSs 21.1 to (n+1) and the NMOSs 25.1 to (n+1) are connected to the current control circuit 121 to function as current sources for supplying the current having a magnitude which is proportional to the magnitude of an input voltage signal VIN to the inverters 20.1 to (n+1), respectively.

The inverters 20.1 to (n+1) invert and output respective input levels (the high or low level). In addition, the output is inverted after a delay time passes since the transition of the input from one of the levels to the other level. The delay time in which the output of the inverter 20.m rises from the low level to the high level is inversely proportional to the magnitude of the main current of the PMOS 21.m, that is, the magnitude of a (positive) source current which is supplied from the high potential side power line 11 to the inverter 20.m through the PMOS 21.m.

The delay time in which the output of the inverter 20.m falls from the high level to the low level is inversely proportional to the magnitude of the main current of the NMOS 25.m, that is, the magnitude of a (negative) source current which is supplied from the ground side power line 12 to the inverter 20.m through the NMOS 25.m. Accordingly, the delay times of the inverter 20.m in which the output rises and falls are inversely proportional to the input voltage signal VIN.

The odd number of inverters 20.1 to n are cascade-connected cyclically (annularly). Taking note of any of the inverters 20.1 to n, it can be, therefore, considered that negative feedback is applied to the same inverter through a delay circuit formed by the even number of other inverters which are cascade-connected. All the inverters have the same structures. For this reason, the output of the inverter which is being noted alternately repeats rise and fall at a time interval which is n times as much as the delay time for each inverter.

Accordingly, if the delay time for rise is equal to the delay time for fall, the inverters 20.1 to n oscillate in a cycle (or period) which is 2 n times as much as the delay time for each inverter. As a result, a clock signal VOUT which oscillates in a cycle that is 2 n times as much as the delay time for each inverter is obtained from the output terminal 14.

Since the delay time is inversely proportional to the input voltage signal VIN, the cycle of the clock signal VOUT is inversely proportional to the input voltage signal VIN. In other words, the frequency of the clock signal VOUT is proportional to the input voltage signal VIN. Even though the delay time for rise is not equal to the delay time for fall, the proportional relationship between the frequency and the input voltage signal VIN is not changed.

In the replica circuit 36, the input of the inverter 20.(n+1) is connected to the ground side power line 12. Consequently, the output of the inverter 20.(n+1) always has the high level. Since the replica circuit 36 has the same structure as that of each of the current controlled delay circuits 26.1 to (n+1), the magnitude (voltage value) of the output of the inverter 20.(n+1) is equal to the magnitude (voltage value) of the output obtained when the inverters 20.1 to n output the high level. In other words, the output of the inverter 20.(n+1) reflects the high level outputs of the inverters 20.1 to n.

The differential amplifier 35 compares the reference potential Vref inputted to the non-inversion input with the output of the inverter 20.(n+1) which is inputted to the inversion input. If the reference potential Vref is higher than the output of the inverter 20.(n+1), the differential amplifier 35 increases the output. If the reference potential Vref is lower than the output of the inverter 20.(n+1), the differential amplifier 35 reduces the output. More specifically, the differential amplifier 35 compares the output of the inverter 20.(n+1) with the reference potential Vref, and inverts the difference therebetween for amplification.

The PMOSs 23.1 to (n+1) are turned on to serve to bypass the main current which flows in the PMOSs 21.1 to (n+1) to a VSS power source 12. In other words, the PMOSs 23.1 to (n+1) function as bypass circuits.

The output of the differential amplifier 35 contributes as the gate voltages of the PMOSs 23.1 to (n+1). Consequently, the magnitude of a current component which separates into the PMOSs 23.1 to (n+1) is decreased if the output potential of the differential amplifier 35 is raised. The magnitude of the current component which separates into the PMOSs 23.1 to (n+1) is increased if the output potential of the differential amplifier 35 is lowered. In other words, the differential amplifier 35 functions as a bypass control circuit for controlling the bypass circuit.

Accordingly, if the output (potential) of the inverter 20.(n+1) inputted to the inversion input of the differential amplifier 35 is lower than the reference potential Vref, the PMOSs 23.1 to (n+1) are turned off (cut off). Consequently, the current component which separates into the PMOSs 23.1 to (n+1) becomes zero. As a result, the output of the inverter 20.(n+1) is raised toward the potential of the high potential side power line 11.

On the contrary, if the output of the inverter 20.(n+1) is higher than the reference potential Vref, the PMOSs 23.1 to (n+1) are turned on (conducted) so that the currents which flow in the PMOSs 21.1 to (n+1) are bypassed to the PMOSs 23.1 to (n+1). As a result, the output of the inverter 20.(n+1) is lowered toward the potential of the ground side power line 12.

Thus, the output of the inverter 20.(n+1) keeps the same value as that of the reference potential Vref by the negative feedback action of a negative feedback loop which includes the differential amplifier 35, the PMOSs 23.1 to (n+1), and the PMOS 22.(n+1). Each of the current controlled delay circuits 26.1 to n has the same structure as that of the replica circuit 36. In addition, the PMOSs 23.1 to (n+1) having the same structures are connected to the current controlled delay circuits 26.1 to n and the replica circuit 36, respectively.

For this reason, the high level outputs (potentials) of the inverters 20.1 to n also keep the same value as the reference potential Vref. The reference potential Vref has a constant value which is independent of the potential of the high potential side power line 11. Consequently, the high level outputs of the inverters 20.1 to n keep constant values irrespective of the potential of the high potential side power line 11.

Figure 3:
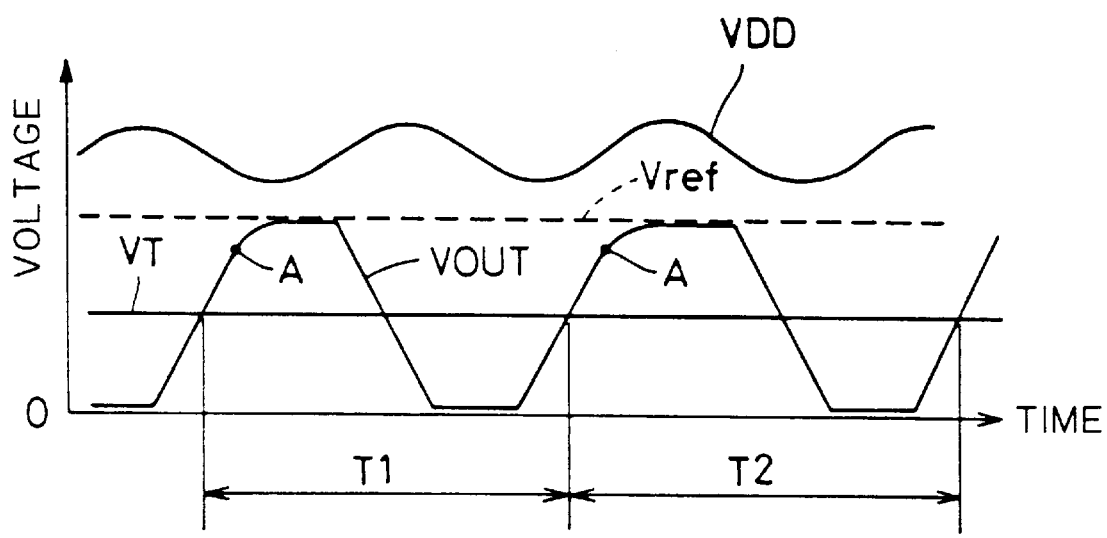
FIG. 3 is a graph for explaining the operation of the VCO according to the first embodiment of the present invention.

Accordingly, the waveform of the clock signal VOUT is illustrated by a graph of FIG. 3. As shown in FIG. 3, even though a potential difference between the high potential side power line 11 and the ground side power line 12, that is, a potential VDD of the high potential side power line 11 is varied, the high level potentials of the outputs of the inverters 20.1 to n which are represented by the clock signal VOUT are held to have the same value as that of the reference potential Vref. In other words, the clock signal VOUT transits between the ground side power line 12 and the reference potential Vref irrespective of the potential VDD of the high potential side power line 11.

As a result, the curve of the clock signal VOUT traverses, at regular time intervals, a threshold voltage VT which is a reference value to distinguish the clock signals VOUT into the high and low levels, irrespective of the fluctuation of the high potential side source potential VDD. Accordingly, the cycle of the clock signal VOUT is kept constant. As illustrated in FIG. 3, two cycles T1 and T2 are equal to each other so that the fluctuation of the cycle of the clock signal VOUT, that is, a period jitter is suppressed.

By the fine observation of the waveform of the clock signal VOUT during rise, it is apparent that the clock signal VOUT is raised gently after a level A is exceeded as typically shown in FIG. 3. In other words, the roundness appears in the curved portion. The reason is that the PMOS 23.m does not discontinuously implement the ON state and the OFF state in a strict sense by setting an inherent gate threshold voltage Vth to a boundary but the transition state which connects the OFF state and the ON state exists and the current which flows in the PMOS 21.m separates into the PMOS 22.m and the PMOS 23.m under this condition. This characteristic does not have an important influence on the suppression of the period jitter if the reference potential Vref is set much higher than the threshold voltage Vth.

<2. Second Embodiment>

Figure 4:
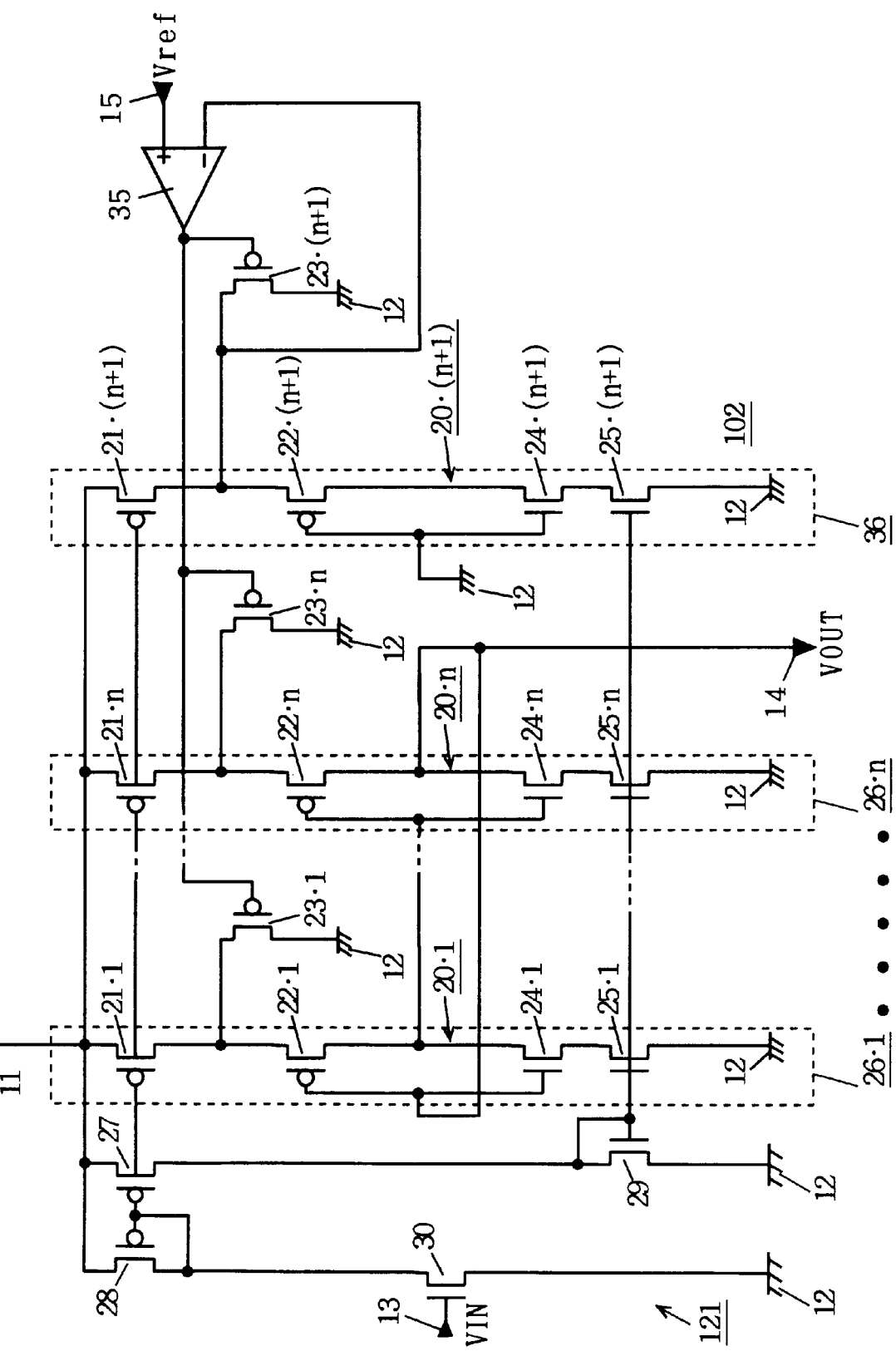
FIG. 4 is a circuit diagram showing a VCO according to a second embodiment of the present invention.

FIG. 4 is a circuit diagram showing the structure of a VCO according to a second embodiment. In the following drawings, the same portions have the same reference numerals as in the device according to the first embodiment shown in FIG. 1, and their detailed description will be omitted.

A VCO 102 according to the present embodiment is characteristically different from the VCO 101 shown in FIG. 1 in that the output of an inverter 20.(n+1) is not inputted to the inversion input of a differential amplifier 35 but the potential of the connecting portion of a PMOS 21.(n+1), a PMOS 22.(n+1) and a PMOS 23.(n+1), that is, the potential of the source electrode of the PMOS 22.(n+1) is inputted thereto. In the VCO 102, the potential of the source electrode of the PMOS 22.(n+1) keeps the same value as that of a reference potential Vref.

As a result, the output of the inverter 20.(n+1) and the high level outputs of inverters 20.1 to n are held at a constant value which is substantially equal to that of the reference potential Vref. Also in the VCO 102, accordingly, a period jitter caused by the fluctuation of the potential of a high potential side power line 11 is suppressed in the same manner as in the VCO 101.

In addition, a negative feedback loop is formed by the differential amplifier 35 and the PMOS 23.(n+1) and does not include the PMOS 22.(n+1) unlike the VCO 101 shown in FIG. 1. For this reason, the response time of the negative feedback loop is short. As compared with the VCO 101 shown in FIG. 1, consequently, it is possible to suppress the influence of the fluctuation of the potential of the high potential side power line 11 within the range of a higher frequency.

<3. Third Embodiment>

Figure 5:
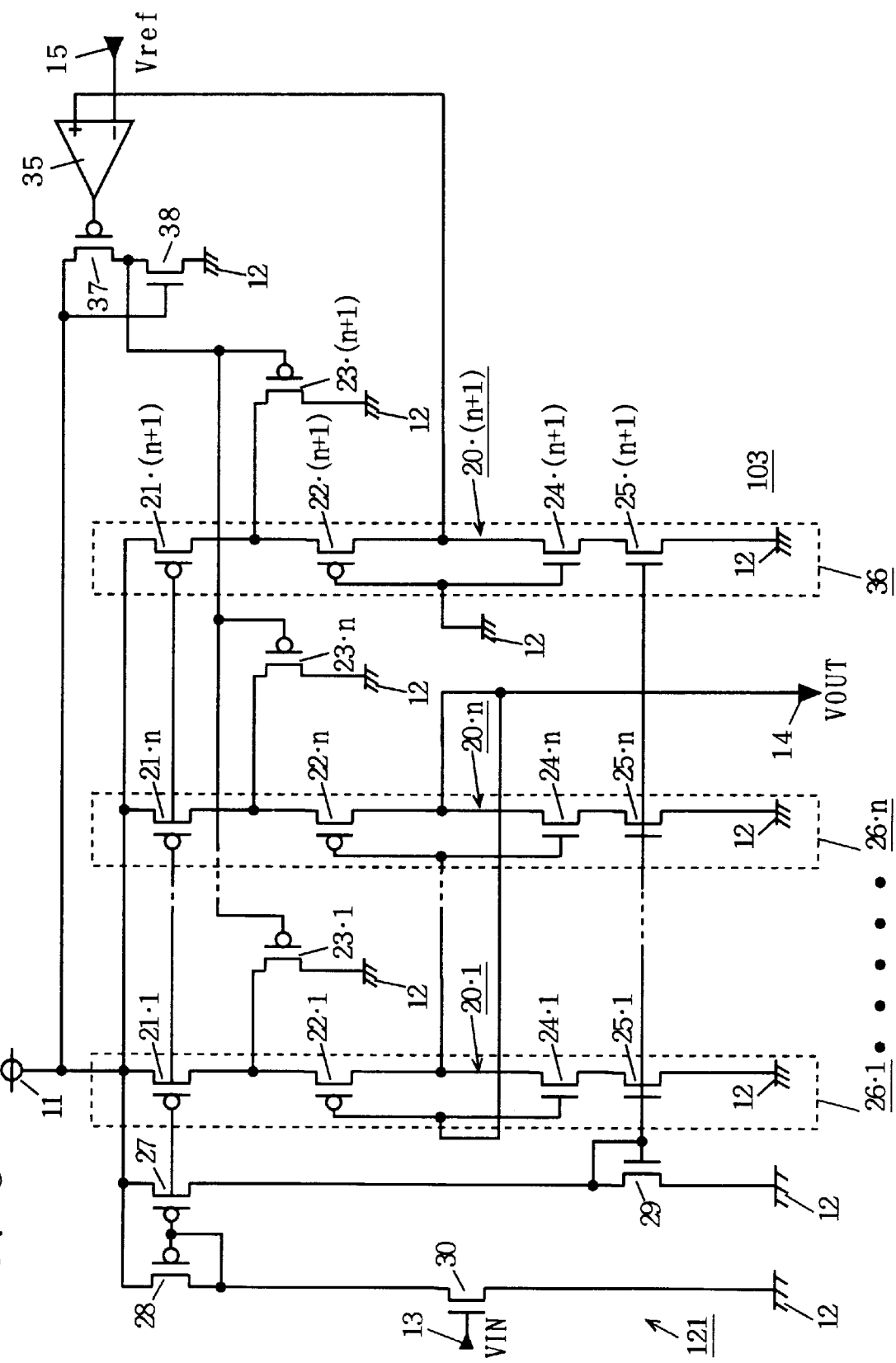
FIG. 5 is a circuit diagram showing a VCO according to a third embodiment of the present invention.

FIG. 5 is a circuit diagram showing the structure of a VCO according to a third embodiment. A VCO 103 shown in FIG. 5 is characteristically different from the VCO 101 shown in FIG. 1 in that a driving circuit having a PMOS 37 and an NMOS 38 is provided between the output of a differential amplifier 35 and the gate electrodes of PMOSs 23.1 to (n+1). In addition, the output of an inverter 20.(n+1) is inputted to the non-inversion input of the differential amplifier 35 and a reference potential Vref is inputted to the inversion input of the differential amplifier 35.

The PMOS 37 has a source electrode connected to a high potential side power line 11 and a drain electrode connected to the drain electrode of the NMOS 38. Furthermore, the output of the differential amplifier 35 is inputted to the gate electrode of the PMOS 37. The NMOS 38 has a source electrode connected to a ground side power line 12 and a gate electrode connected to the high potential side power line 11. More specifically, the NMOS 38 is always in the ON state and functions as a load having a resistance value which is equivalent to the ON-state resistance for the PMOS 37. The drain electrode of the PMOS 37 is also connected to the gate electrodes of the PMOSs 23.1 to (n+1).

If the output of the inverter 20.(n+1) is higher than the reference potential Vref, the output of the differential amplifier 35 is raised. As a result, the main current of the PMOS 37 is reduced so that the potentials of the gate electrodes of the PMOSs 23.1 to (n+1) are lowered. Consequently, the PMOSs 23.1 to (n+1) are turned on so that the currents of PMOSs 21.1 to (n+1) are bypassed. Therefore, the potential of the output of the inverter 20.(n+1) is lowered.

On the contrary, if the output of the inverter 20.(n+1) is lower than the reference potential Vref, the output of the differential amplifier 35 is lowered. As a result, the main current of the PMOS 37 is increased so that the potentials of the gate electrodes of the PMOSs 23.1 to (n+1) are raised. Consequently, the PMOSs 23.1 to (n+1) are turned off so that the potential of the output of the inverter 20.(n+1) is raised.

Thus, the output of the inverter 20.(n+1) is held to have the same value as that of the reference potential Vref in the same manner as in the VCO 101 shown in FIG. 1 by the operation of a negative feedback loop formed by the differential amplifier 35, the PMOS 37, the NMOS 38 and a PMOS 22.(n+1).

The gate electrodes of the PMOSs 23.1 to (n+1) are connected to the high potential side power line 11 through the PMOS 37, and are connected to the ground side power line 12 through the NMOS 38. For this reason, the driving circuit functions to amplify a current outputted from the differential amplifier 35. As a result, it is possible to drive a lot of PMOSs 23.1 to (n+1) at a higher speed. Consequently, the negative feedback loop can show the negative feedback function even though the potential of the high potential side power line 11 fluctuates at a high frequency. As a result, the fluctuation of the cycle of a clock signal VOUT can be suppressed even though the potential fluctuates at a higher frequency.

Furthermore, the gate electrode of the NMOS 38 is connected to the high potential side power line 11. Consequently, the ON-state resistance of the NMOS 38 is decreased or increased when the potential of the high potential side power line 11 is raised or lowered. If the potential of the high potential side power line 11 fluctuates at such a high frequency that the output of the differential amplifier 35 cannot follow, the decrease and increase in the ON-state resistance cause the potential of the drain electrode of the NMOS 38, that is, the potentials of the gate electrodes of the PMOSs 23.1 to (n+1) to be lowered and raised, respectively.

When the potentials of the gate electrodes of the PMOSs 23.1 to (n+1) are lowered or raised, the main currents which flow in the PMOSs 23.1 to (n+1) are increased or decreased. For this reason, the fluctuation of the output of the inverter 20.(n+1), that is, the fluctuation of the high level outputs of the inverters 20.1 to n can be suppressed. More specifically, also in the case where the potential of the high potential side power line 11 fluctuates at such a high frequency that the differential amplifier 35 cannot follow any longer, the fluctuation of the high level outputs of the inverters 20.1 to n is suppressed by the negative feedback action of the NMOS 38. Accordingly, the period jitter of the clock signal VOUT can be suppressed.

Figure 6:
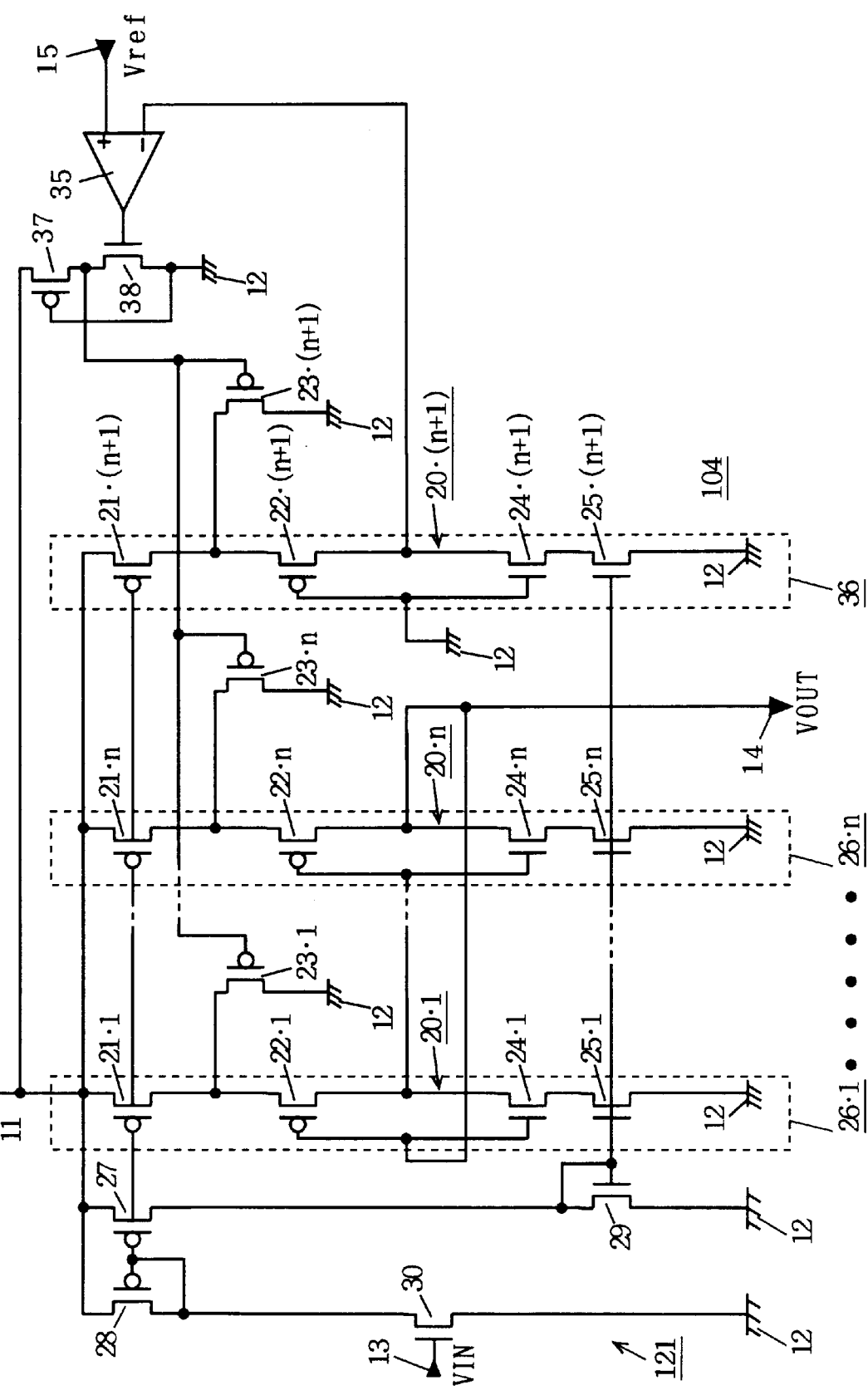
FIG. 6 is a circuit diagram showing a variant of the VCO according to the third embodiment of the present invention.
Figure 7:
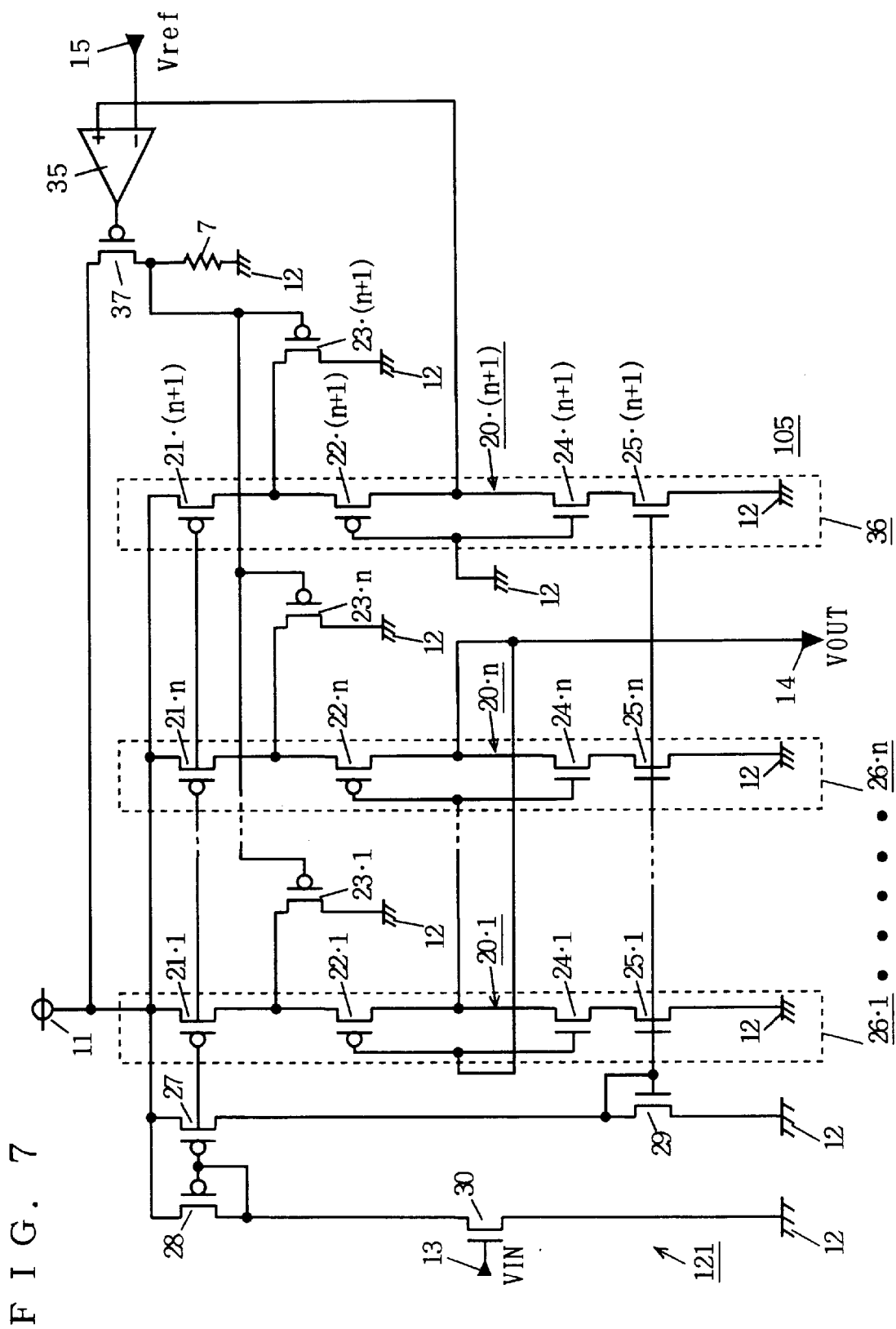
FIG. 7 is a circuit diagram showing another variant of the VCO according to the third embodiment of the present invention.
Figure 8:
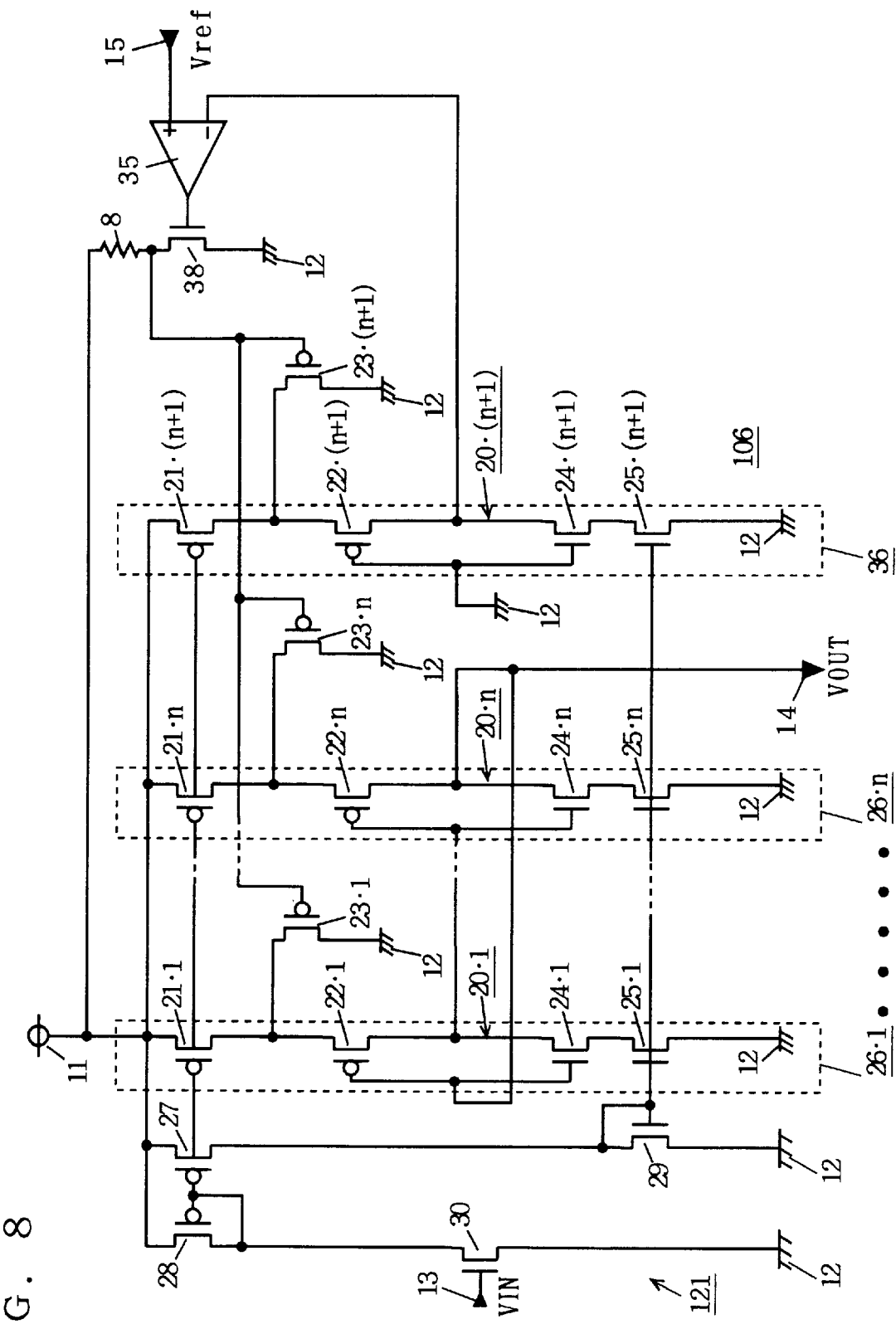
FIG. 8 is a circuit diagram showing a further variant of the VCO according to the third embodiment of the present invention.

FIGS. 6 to 8 are circuit diagrams showing a variant of the VCO 103. A VCO 104 shown in FIG. 6 is characteristically different from the VCO 103 shown in FIG. 5 in that the output of a differential amplifier 35 is inputted to the gate electrode of an NMOS 38 and the gate electrode of a PMOS 37 is connected to a ground side power line 12 in a driving circuit formed by the PMOS 37 and the NMOS 38.

More specifically, the differential amplifier 35 drives the NMOS 38, and the PMOS 37 is always in the ON state and is formed in such a manner that the ON-state resistance functions as the load of the NMOS 38. In order to implement the negative feedback action, the output of the inverter 20.(n+1) is inputted to the inversion input of the differential amplifier 35, and a reference potential Vref is inputted to the non-inversion input of the differential amplifier 35.

Also in the VCO 104, a negative feedback loop is formed by the differential amplifier 35, the NMOS 38, a PMOS 23.(n+1) and a PMOS 22.(n+1). Consequently, the output of the inverter 20.(n+1) is held to have the same value as that of the reference potential Vref in the same manner as in the VCO 103. In addition, the driving circuit is provided between the differential amplifier 35 and PMOSs 23.1 to (n+1). Consequently, a lot of PMOSs 23.1 to (n+1) can be driven at a higher speed in the same manner as in the VCO 103.

Furthermore, the gate electrode of the PMOS 37 is connected to the ground side power line 12. Therefore, as the potential of a high potential side power line 11 is raised or lowered, the ON-state resistance of the PMOS 37 is increased or decreased. For this reason, also in the case where the potential of the high potential side power line 11 fluctuates at such a high frequency that the differential amplifier 35 cannot follow, the fluctuation of the high level outputs of the inverters 20.1 to n is suppressed by the negative feedback action of the PMOS 37 in the same manner as in the VCO 103. Accordingly, the period jitter of a clock signal VOUT can be suppressed.

A VCO 105 shown in FIG. 7 is characteristically different from the VCO 103 shown in FIG. 5 in that the NMOS 38 is replaced with a resistive element 7. Also in the VCO 105, a negative feedback loop is formed by a differential amplifier 35, a PMOS 37, a PMOS 23.(n+1) and a PMOS 22.(n+1). Consequently, the output of an inverter 20.(n+1) is held to have the same value as that of a reference potential Vref in the same manner as in the VCO 103. By setting the resistance value of the resistive element 7 much lower than the output resistance of the differential amplifier 35, a lot of PMOSs 23.1 to (n+1) can be driven at a higher speed in the same manner as in the VCO 103.

A VCO 106 shown in FIG. 8 is characteristically different from the VCO 104 shown in FIG. 6 in that the PMOS 37 is replaced with a resistive element 8. Also in the VCO 106, a negative feedback loop is formed by a differential amplifier 35, an NMOS 38, a PMOS 23.(n+1) and a PMOS 22.(n+1). Consequently, the output of an inverter 20.(n+1) is held to have the same value as that of a reference potential Vref in the same manner as in the VCO 104.

By setting the resistance value of the resistive element 8 much lower than the output resistance of the differential amplifier 35, a lot of PMOSs 23.1 to (n+1) can be driven at a higher speed in the same manner as in the VCO 104. Furthermore, since the PMOS 37 is replaced with the resistive element 8 having a simple structure, the device can be manufactured more easily. In addition, a MOS transistor provided in a driving circuit is the NMOS 38 whose main current is about twice as much as that of the PMOS 37 having the same size. As compared with the VCO 105, therefore, the driving capacities of the PMOSs 23.1 to (n+1) can be set greater in the device having the same size. Furthermore, the size of the device can be reduced with the identical driving capacities.

In the VCOs 105 and 106, the PMOS 37 or the NMOS 38 may be formed by a bipolar transistor, which is not shown.

<4. Fourth Embodiment>

Figure 9:
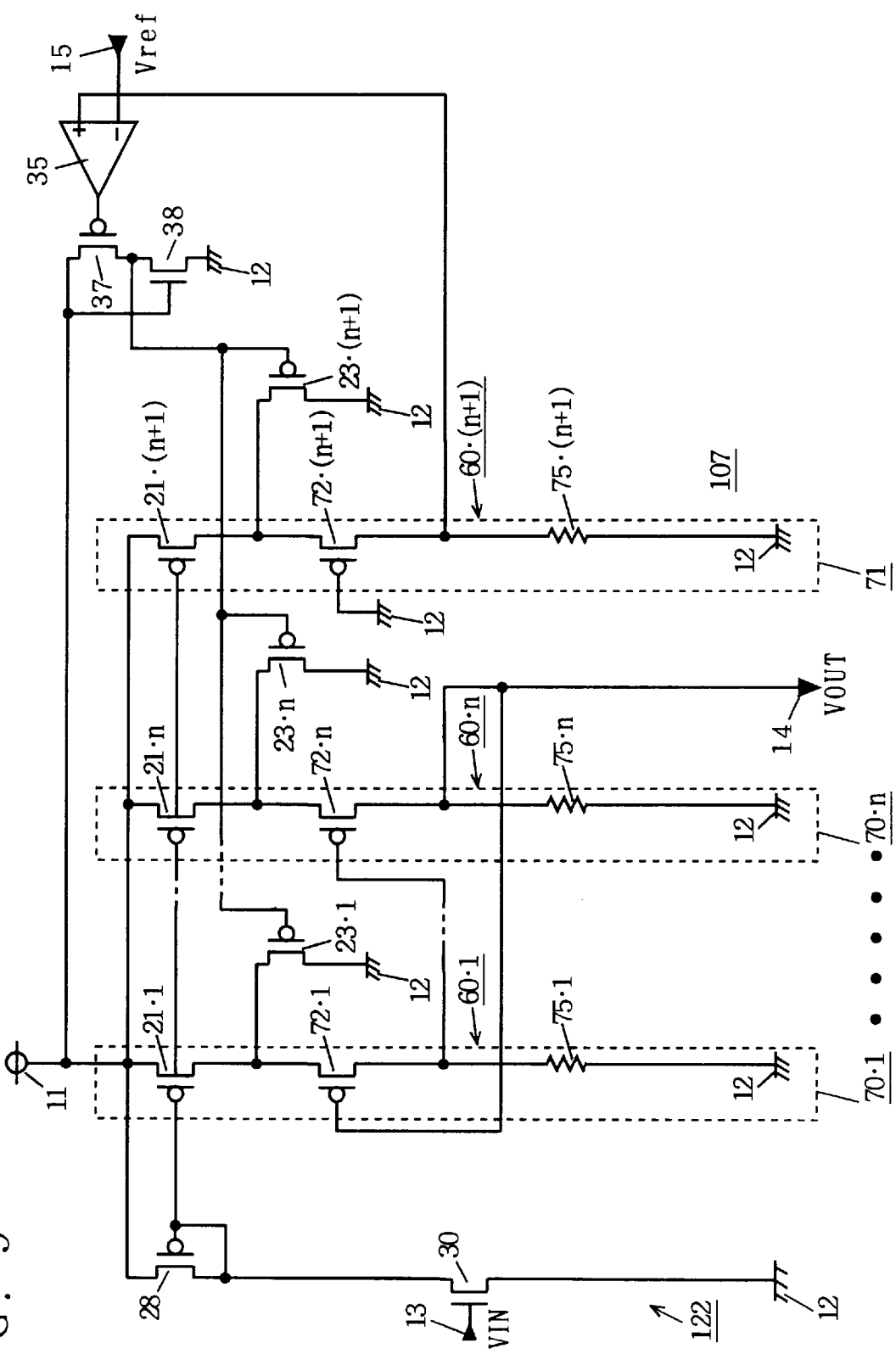
FIG. 9 is a circuit diagram showing a VCO according to a fourth embodiment of the present invention.

FIG. 9 is a circuit diagram showing the structure of a VCO according to a fourth embodiment. A VCO 107 is characteristically different from the VCO 103 shown in FIG. 5 in that the current controlled delay circuits 26.1 to n are replaced with current controlled delay circuits 70.1 to n and the replica circuit 36 is replaced with a replica circuit 71. Each of the current controlled delay circuits 70.1 to n has a structure which is identical to that of the replica circuit 71.

A current controlled delay circuit 70.k includes PMOSs 21.k and 72.k, and a resistive element 75.k. The drain electrode of the PMOS 72.k is connected to one of ends of the resistive element 75.k. More specifically, the PMOS 72.k and the resistive element 75.k form an inverter 60.k.

The connecting portion of the PMOS 72.k and the resistive element 75.k, that is, the drain electrode of the PMOS 72.k corresponds to the output of the inverter 60.k. The gate electrode of the PMOS 72.k corresponds to the input of the inverter 60.k. The PMOS 21.k has a source electrode connected to a high potential side power line 11 and a drain electrode connected to the source electrode of the PMOS 72.k.

More specifically, since the PMOS 21.k forms a current mirror circuit together with the PMOS 28, it functions as a current source on the high potential side which supplies a current to the inverter 60.k. On the other hand, the other electrode of the resistive element 75.k is connected to a ground side power line 12. Unlike the current controlled delay circuits 26.1 to n, a current source on the low potential side is not provided.

The current controlled delay circuits 70.1 to n are cascade-connected cyclically (annularly) in the same manner as in the current controlled delay circuits 26.1 to n. In other words, the output of the current controlled delay circuit 70.1, that is, the output of an inverter 60.1 is connected to the input of a current controlled delay circuit 70.2 provided on the next stage, that is, the input of an inverter 60.2 provided on the next stage. In the same manner, the output of each stage is connected to the input of the next stage. The output of the current controlled delay circuit 70.n is connected to the input of the current controlled delay circuit 70.1.

Accordingly, the inverters 60.1 to n oscillate in the same manner as the inverters 20.1 to n. The output signal of one of the current controlled delay circuits 70.1 to n (the current controlled delay circuit 70.n in an example of FIG. 9) is fetched as a clock signal VOUT to the outside through an output terminal 14.

The replica circuit 71 includes a PMOS 21.(n+1) having the same structure as that of the PMOS 21.k, a PMOS 72.(n+1) having the same structure as that of the PMOS 72.k, and a resistive element 75.(n+1) having the same structure as that of the resistive element 75.k. These elements are connected to each other as in the current controlled delay circuit 70.k. In other words, the replica circuit 71 have the same structure as that of the current controlled delay circuit 70.k.

The input of an inverter 60.(n+1), that is, the gate electrode of the PMOS 72.(n+1) is connected to a ground side power line 12. More specifically, the potential of the input of the replica circuit 71 is fixed to a ground potential in the same manner as in the replica circuit 36.

The inverters 60.1 to (n+1) do not include a current source on the low potential side but a current source on the high potential side, that is, PMOSs 21.1 to (n+1). Accordingly, a current control circuit 122 is formed more simply than the current control circuit 121. In other words, only a first serial circuit of the current control circuit 121 is provided in the current control circuit 122.

In the same manner as in the current control circuit 121, the gate electrode of a PMOS 28 which belongs to the first serial circuit is connected to all the gate electrodes of the PMOSs 21.1 to (n+1) in common. For this reason, a current having a magnitude which is proportional to the magnitude of an input voltage signal VIN is supplied from the high potential side power line 11 to the inverters 60.1 to (n+1).

The VCO 107 is the same as the VCO 103 shown in FIG. 5 in that PMOSs 23.1 to (n+1) are connected to the drain electrodes of the PMOSs 21.1 to (n+1) respectively and a negative feedback loop is formed by a differential amplifier 35, a PMOS 37, an NMOS 38, the PMOS 23.(n+1) and the PMOS 72.(n+1). Consequently, the output of the inverter 60.(n+1), that is, the potential of the drain electrode of the PMOS 72.(n+1) is held to have the same value as that of a reference potential Vref.

Unlike the VCO 103, a current source on the low potential side which is controlled by the input voltage signal VIN is not provided in the VCO 107. For this reason, the delay time in which the outputs of the inverters 60.1 to n fall from the high level to the low level has a constant value which does not depend on the input voltage signal VIN. The input voltage signal VIN regulates only the delay time in which the outputs of the inverters 60.1 to n rise from the low level to the high level. Consequently, the frequency of a clock signal VOUT is variable.

The frequency of the clock signal VOUT is proportional to the input voltage signal VIN in the same manner as in the VCOs 101 to 106. However, a proportional coefficient, that is, the sensitivity of the frequency of the clock signal VOUT to the input voltage signal VIN is about half of that of each of the VCOs 101 to 106.

Figure 10:
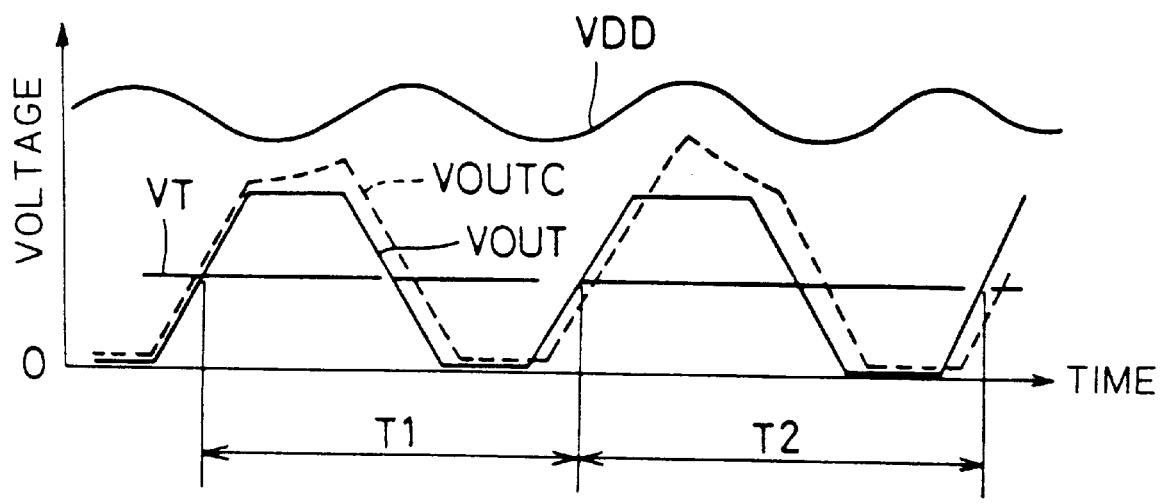
FIG. 10 is a graph for explaining the operation of the VCO according to the fourth embodiment of the present invention.

The waveform of the clock signal VOUT in the VCO 107 is shown by a graph of FIG. 10. As shown in FIG. 10, even though a potential VDD of the high potential side power line 11 fluctuates, the high level potential of the clock signal VOUT which is the output of one of the inverters 60.1 to n is held to have the same value as that of the reference potential Vref. In contrast with the waveform of a clock signal VOUTC of a device according to the prior art which is illustrated for comparison, the waveform of the clock signal VOUT is not influenced by the potential VDD.

As a result, the cycle of the clock signal VOUT is not influenced by the fluctuation of the high potential side source potential VDD but is kept constant. As shown in FIG. 10, cycles T1 and T2 are equal to each other and the fluctuation of the cycle of the clock signal VOUT, that is, a period jitter is suppressed. Thus, even though NMOSs 25.1 to (n+1) which function as current sources on the low potential side are not provided, it is possible to obtain the effect that the period jitter is suppressed in the same manner as in the VCOs 101 to 106.

Figure 11:
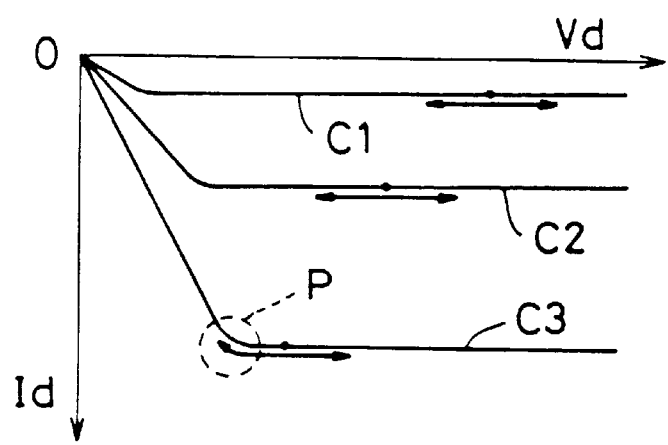
FIG. 11 is a graph for explaining the operation of the VCO according to the fourth embodiment of the present invention.
Figure 12:
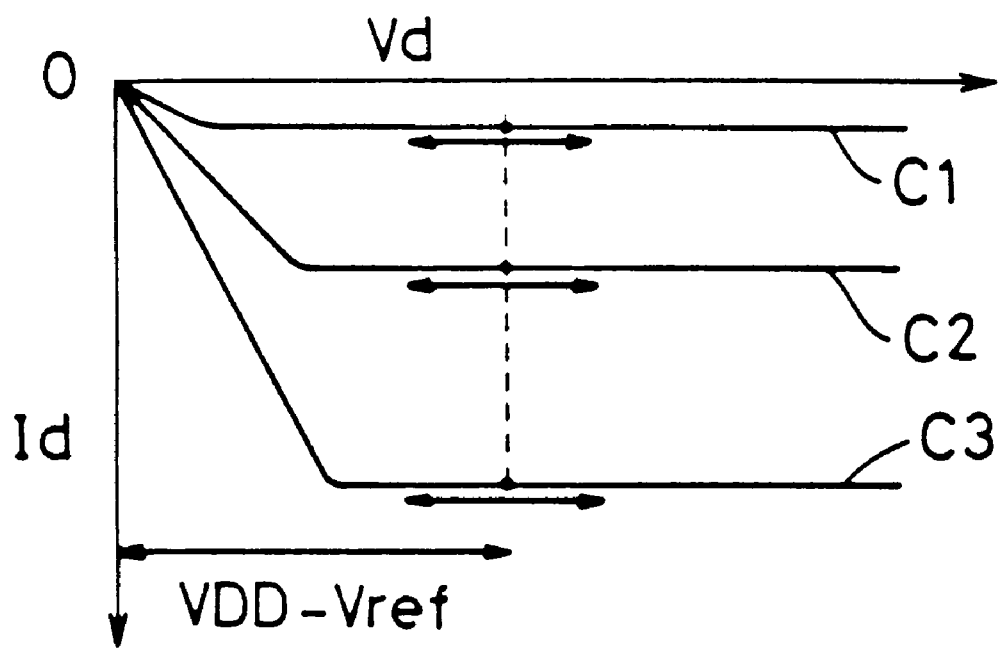
FIG. 12 is a graph for explaining the operation of the VCO according to the fourth embodiment of the present invention.

FIGS. 11 and 12 are graphs showing the output characteristics of a PMOS 21.m to explain the foregoing in more detail. More specifically, FIG. 11 shows the characteristics obtained when the negative feedback loop is not provided, that is, the characteristics of the device according to the prior art for comparison. FIG. 12 shows the characteristics of the VCO 107. In FIGS. 11 and 12, curves C1, C2 and C3 represent the output characteristics which are sequentially changed in this order as the magnitude of the input voltage signal VIN is increased.

As shown in FIG. 11, when the magnitude of the input voltage signal VIN is increased so that a drain current (main current) Id is increased in the device according to the prior art, an operating point expressed by a black circle is moved in the direction where a drain-source voltage Vd is reduced. The operating point fluctuates within the range shown by an arrow due to an electrical noise which is superposed on the drain-source voltage Vd. Accordingly, when the magnitude of the drain current Id is great, the operating point enters a non-saturation region due to the electrical noise as shown by P in FIG. 11 so that the drain current Id fluctuates. As a result, the period jitter appears on the clock signal VOUTC as shown in FIG. 10 simultaneously with the fluctuation of a potential having the high level.

In the VCO 107, the operating point is kept in a position where the drain-source voltage Vd is constant without depending on the magnitude of the input voltage signal VIN by the operation of the negative feedback loop as shown in FIG. 12. For this reason, even though the operating point is changed by the electrical noise, the drain current Id does not fluctuate but the potential having the high level is kept constant. Consequently, the period jitter shown in FIG. 10 does not appear on the clock signal VOUT.

While the description has been omitted in the first to third embodiments, the operation of the VCO 107 shown in FIG. 12 is the same as that of the VCOs 101 to 106.

<5. Fifth Embodiment>

Figure 13:
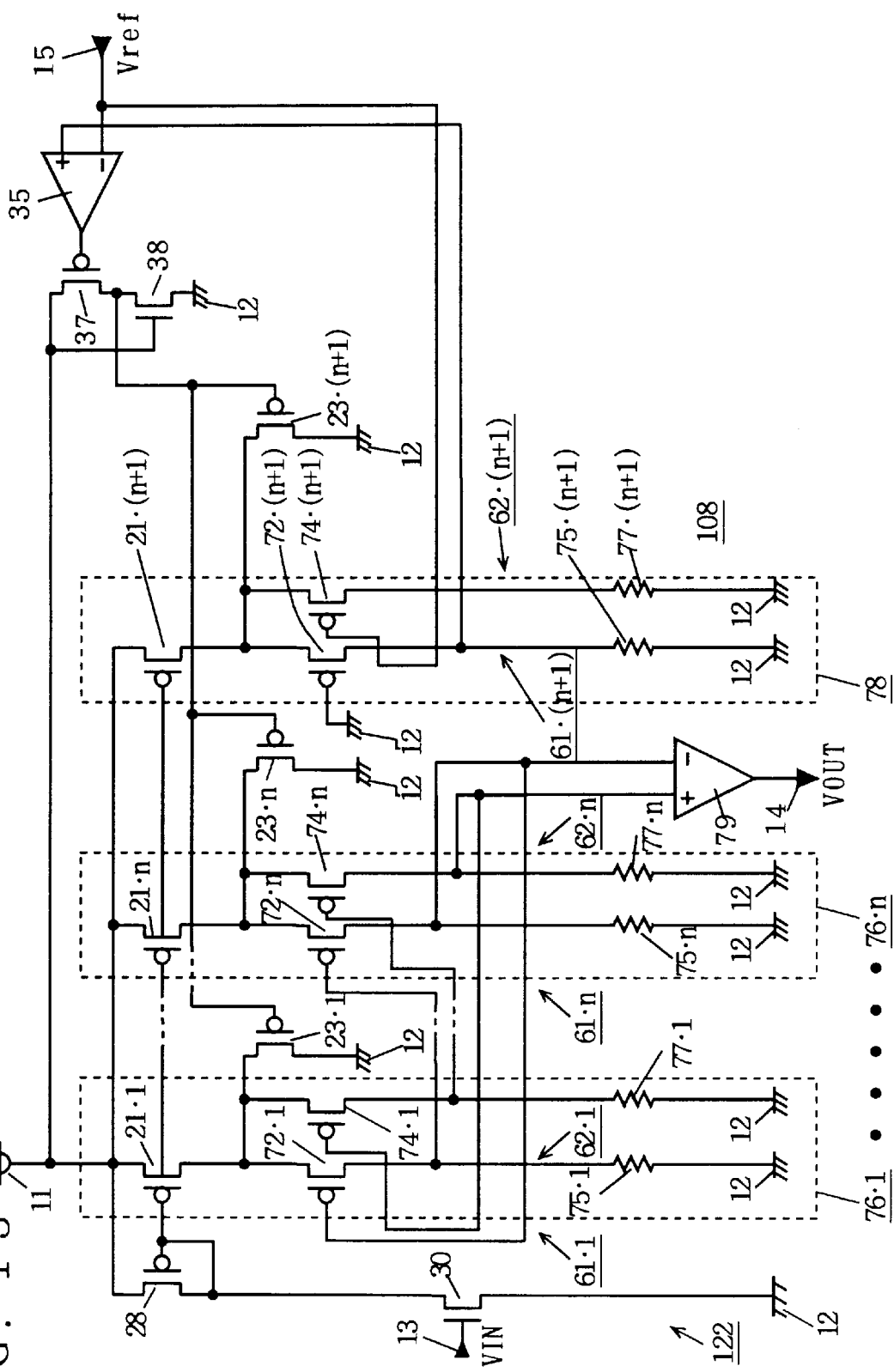
FIG. 13 is a circuit diagram showing a VCO according to a fifth embodiment of the present invention.

FIG. 13 is a circuit diagram showing the structure of a VCO according to a fifth embodiment. A VCO 108 is obtained as if the VCO 107 shown in FIG. 9 is extended to a differential VCO. More specifically, the current controlled delay circuits 70.1 to n of the VCO 107 are replaced with current controlled delay circuits 76.1 to n, and the replica circuit 71 is replaced with a replica circuit 78. Each of the current controlled delay circuits 76.1 to n has a structure which is identical to that of the replica circuit 78. In the differential VCO 108, a differential amplifier 79 is connected to an output terminal 14.

In a current controlled delay circuit 76.k, an inverter 61.k formed by a serial circuit including a PMOS 72.k and a resistive element 75.k, and an inverter 62.k formed by a serial circuit including a PMOS 74.k and a resistive element 77.k are provided between a ground side power line 12 and a PMOS 21.k which functions as a current source on the high potential side. In addition, the PMOS 74.k and the resistive element 77.k have the same structures as those of the PMOS 72.k and the resistive element 75.k, respectively. In other words, the inverters 61.k and 62.k having the same structures are connected in parallel between the PMOS 21.k and the ground side power line 12.

The current controlled delay circuits 76.1 to n are cascade-connected cyclically (annularly) in the same manner as the current controlled delay circuits 70.1 to n. More specifically, the outputs of inverters 61.1 and 62.1 which belong to the current controlled delay circuit 76.1 are respectively connected to the inputs of inverters 61.2 and 62.2 which belong to the current controlled delay circuit 76.2 provided on the next stage. In the same way, the outputs of two inverters provided on each stage are individually connected to the inputs of two inverters provided on the next stage, respectively. The outputs of inverters 61.n and 62.n of the current controlled delay circuit 76.n are connected to the inputs of the inverters 61.1 and 62.1 of the current controlled delay circuit 76.1, respectively.

Accordingly, the inverters 61.k and 62.k (k=1 to n) provided on each stage oscillate in opposite phases to each other. The outputs of the two inverters which belong to one of the current controlled delay circuits 76.1 to n (the current controlled delay circuit 76.n in an example of FIG. 13) are inputted to the non-inversion input and the inversion input of the differential amplifier 79, respectively. A clock signal VOUT is outputted from the differential amplifier 79 to the outside through the output terminal 14. Consequently, the clock signal VOUT is sent as a signal which is obtained by amplifying a difference between two inverters that oscillate in opposite phases.

Similarly to the VCO 107 shown in FIG. 9, the gate electrode of a PMOS 28 which belongs to a current control circuit 122 is connected to all the gate electrodes of PMOSs 21.1 to (n+1) in common. For this reason, a current having a magnitude which is proportional to the magnitude of an input voltage signal VIN is supplied from a high potential side power line 11 to the inverters 61.k and 62.k which belong to the current controlled delay circuit 76.k (k=1 to n). In the same manner as in the VCO 107, accordingly, the frequency of the clock signal VOUT is proportional to the input voltage signal VIN.

The replica circuit 78 includes a PMOS 21.(n+1) having the same structure as that of the PMOS 21.k (k=1 to n), PMOSs 72.(n+1) and 74.(n+1) having the same structures as those of the PMOSs 72.k and 74.k, and resistive elements 75.(n+1) and 77.(n+1) having the same structures as those of the resistive elements 75.k and 77.k. Those elements are connected to each other in the same manner as in the current controlled delay circuit 76.k.

In other words, the replica circuit 78 has the same structure as that of the current controlled delay circuit 76.k. The gate electrode of the PMOS 72.(n+1) is connected to a ground side power line 12, and the gate electrode of the PMOS 74.(n+1) is connected to a reference potential Vref. Accordingly, the output of an inverter 61.(n+1) reflects the high level outputs of the inverters 61.1 to n and 62.1 to n.

The VCO 108 is identical to the VCO 107 shown in FIG. 9 in that PMOSs 23.1 to (n+1) are connected to the drain electrodes of the PMOSs 21.1 to (n+1) respectively and a negative feedback loop is formed by a differential amplifier 35, a PMOS 37, an NMOS 38, a PMOS 23.(n+1) and the PMOS 72.(n+1). Accordingly, the output of the inverter 61.(n+1), that is, the potential of the drain electrode of the PMOS 72.(n+1) is held to have the same value as that of the reference potential Vref.

Furthermore, the input of an inverter 62.(n+1), that is, the potential of the gate electrode of the PMOS 74.(n+1) is fixed to the reference potential Vref which is identical to the output of the inverter 61.(n+1). This means that the inverters 61.(n+1) and 62.(n+1) are fixed into the state of opposite phases. Accordingly, the state in which the current controlled delay circuit 76.k outputs the high and low levels is accurately reflected in the replica circuit 78.

Figure 14:
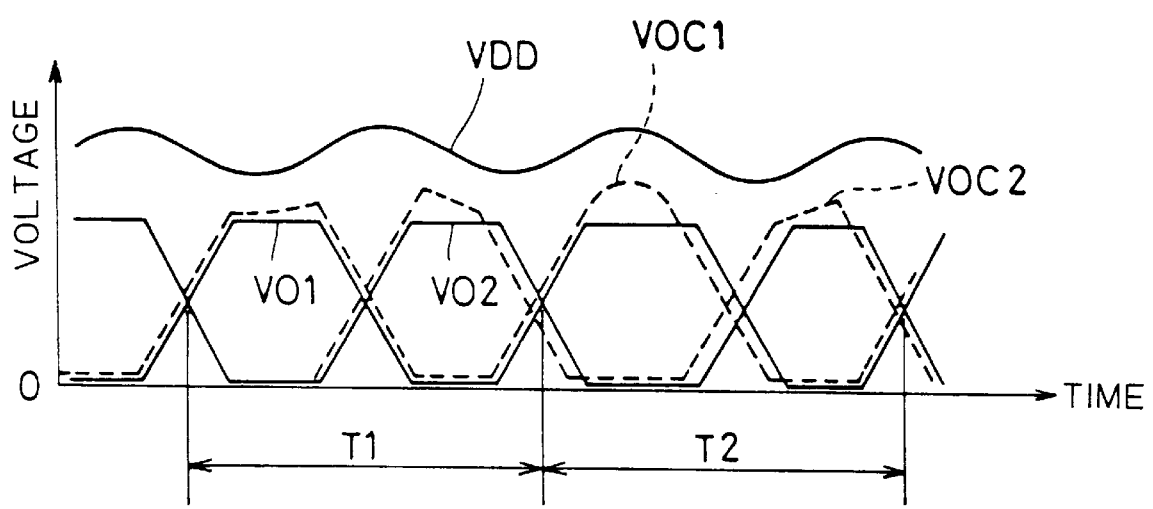
FIG. 14 is a graph for explaining the operation of the VCO according to the fifth embodiment of the present invention.

A graph of FIG. 14 shows the waveforms of differential outputs VO1 and VO2 inputted from the inverters 61.n and 62.n to the differential amplifier 79. As shown in FIG. 14, even though a potential VDD of the high potential side power line 11 fluctuates, the high level potentials of the differential outputs VO1 and VO2 keep the same value as that of the reference potential Vref. In contrast with the waveforms of the differential outputs VOC1 and VOC2 of the differential VCO for comparison in which the negative feedback loop is removed from the VCO 108, the waveforms of the differential outputs VO1 and VO2 are not influenced by the potential VDD.

As a result, the cycle of the clock signal VOUT which is obtained by amplifying the difference between the differential outputs VO1 and VO2 is not influenced by the fluctuation of the high potential side source potential VDD but is kept constant. As shown in FIG. 14, cycles T1 and T2 are equal to each other so that the fluctuation of the cycle of the clock signal VOUT, that is, a period jitter is suppressed. Also in the differential VCO 108, thus, it is possible to obtain the effect that the period jitter is suppressed in the same manner as in the corresponding non-differential VCO 107.

<6. Sixth Embodiment>

Figure 15:
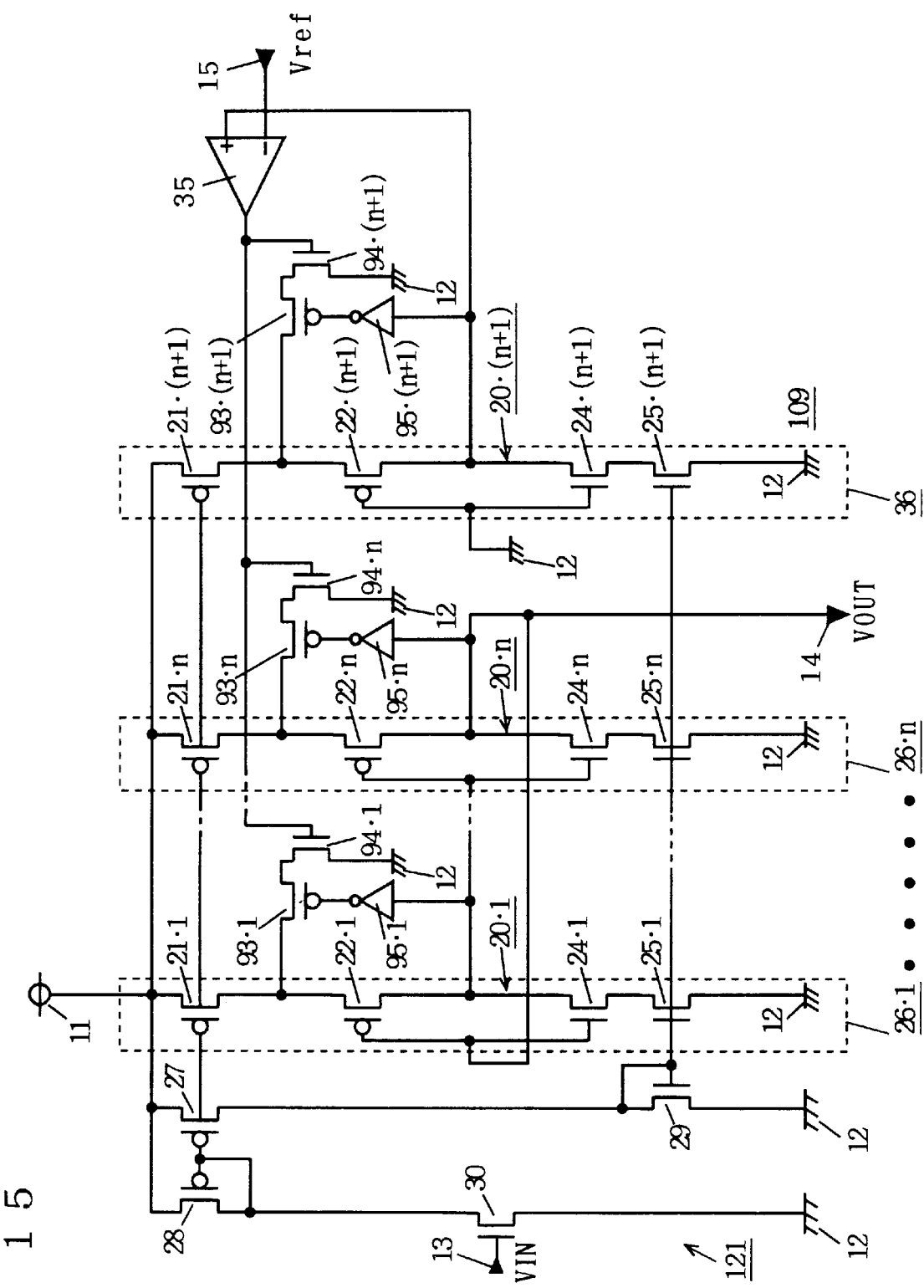
FIG. 15 is a circuit diagram showing a VCO according to a sixth embodiment of the present invention.

In the VCOs 101 to 108 described above, the roundness shown in FIG. 3 appears on the waveform of the clock signal VOUT. FIG. 15 is a circuit diagram showing a VCO according to a sixth embodiment which has such a structure that the roundness is eliminated. A VCO 109 is characteristically different from the VCO 101 in that the PMOS 23.m is replaced with a serial circuit including a PMOS 93.m and an NMOS 94.m, and an inverter 95.m is further provided. More specifically, the source electrode of the PMOS 93.m is connected to the drain electrode of a PMOS 21.m, and the drain electrode of the NMOS 94.m is connected to the drain electrode of the PMOS 93.m. The source electrode of the NMOS 94.m is connected to a ground side power line 12. The output of a differential amplifier 35 is connected to the gate electrodes of NMOSs 94.1 to (n+1) in common.

The input of the inverter 95.m is connected to the connecting portion of a PMOS 22.m and an NMOS 24.m, that is, the output of an inverter 20.m. The output of the inverter 95.m is connected to the gate electrode of the PMOS 93.m. Furthermore, the output of an inverter 20.(n+1) is connected to the non-inversion input of the differential amplifier 35. A reference potential input terminal 15 through which a reference potential Vref passes is connected to the inversion input of the differential amplifier 35.

Figure 16:
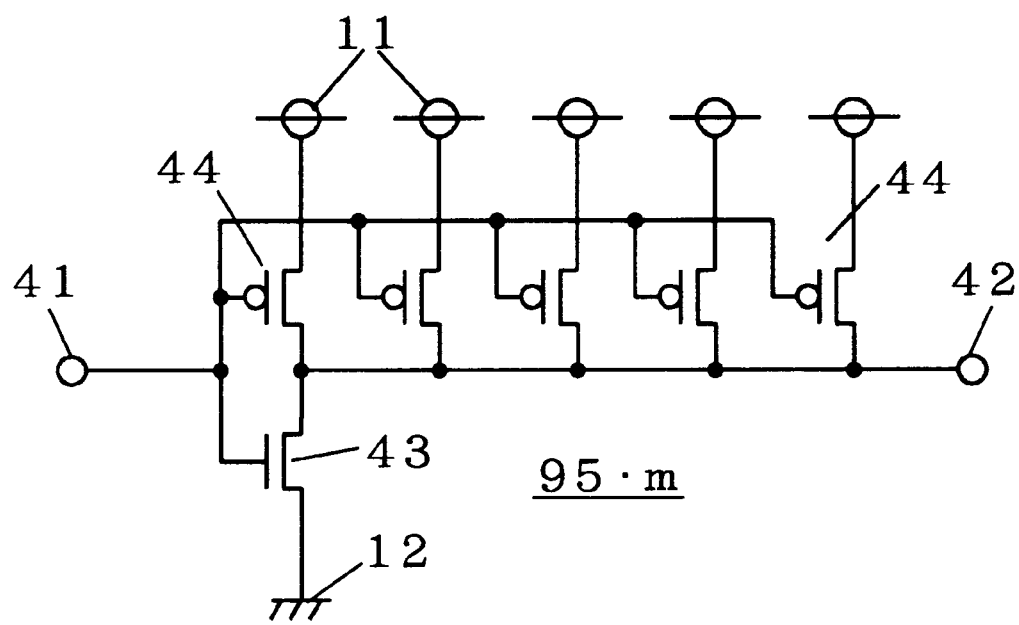
FIG. 16 is a circuit diagram showing an inverter 95.m according to the sixth embodiment of the present invention.

FIG. 16 is a circuit diagram showing an example of the structure of the inverter 95.m. The inverter 95.m is provided with an NMOS 43 and a plurality of PMOSs 44 which are connected in parallel. A parallel circuit having the PMOSs 44 is connected to the NMOS 43 in series. The serial circuit is provided between a high potential side power line 11 and the ground side power line 12.

The gate electrode of the NMOS 43 and the gate electrodes of the PMOSs 44 are connected to an input terminal 41 in common. In addition, the connecting portion of the NMOS 43 and the PMOSs 44 are connected to an output terminal 42. The input terminal 41 is connected to the output of the inverter 20.m. The output terminal 42 is connected to the gate electrode of the PMOS 93.m (FIG. 15).

If a signal inputted to the input terminal 41 has the high level, the NMOS 43 is turned on and the PMOSs 44 are turned off. Consequently, a signal having the low level appears on the output terminal 42. If the signal inputted to the input terminal 41 has the low level, the NMOS 43 is turned off and the PMOSs 44 are turned on. Consequently, a signal having the high level appears on the output terminal 42. In other words, the inverter 95.m functions as an inverter.

In addition, the number of the PMOSs 44 is greater than that of the NMOS 43. Therefore, a threshold voltage which is a reference value to distinguish the signals into the low and high levels that are inputted to the input terminal 41 is shifted to a potential which is higher than the intermediate potential of the high potential side power line 11 and the ground side power line 12. In other words, the inverter 95.m has a structure in which the signal having the low level is outputted when the output of the inverter 20.m exceeds a value which gives the NMOS 94.m the threshold voltage through the differential amplifier 35, to sufficiently approach the high level.

With reference to FIG. 15 again, the operation of the VCO 109 will be described below. In the process for raising the output of the inverter 20.m from the low level to the high level, the output of the inverter 20.m exceeds a value which gives the NMOS 94.m the threshold voltage and is further increased to approach the reference potential Vref, and the PMOS 93.m is then turned on by the operation of the inverter 95.m so that the current of the PMOS 21.m is bypassed to the ground side power line 12. For this reason, the "roundness" shown in FIG. 3 rarely appears on the waveform of the clock signal VOUT. In other words, it is possible to obtain a clock waveform which is very useful and has a sharp edge in the same manner as in the case where the negative feedback loop is not provided.

Furthermore, it is possible to suppress a variation in the waveform of the clock signal VOUT caused by variations in the threshold voltages of the NMOS 94.m (m=1 to n+1) and the PMOS 93.m which are due to deviation in the manufacturing process. Thus, a waveform having high uniformity can be obtained.

<7. Variant>

Figure 17:
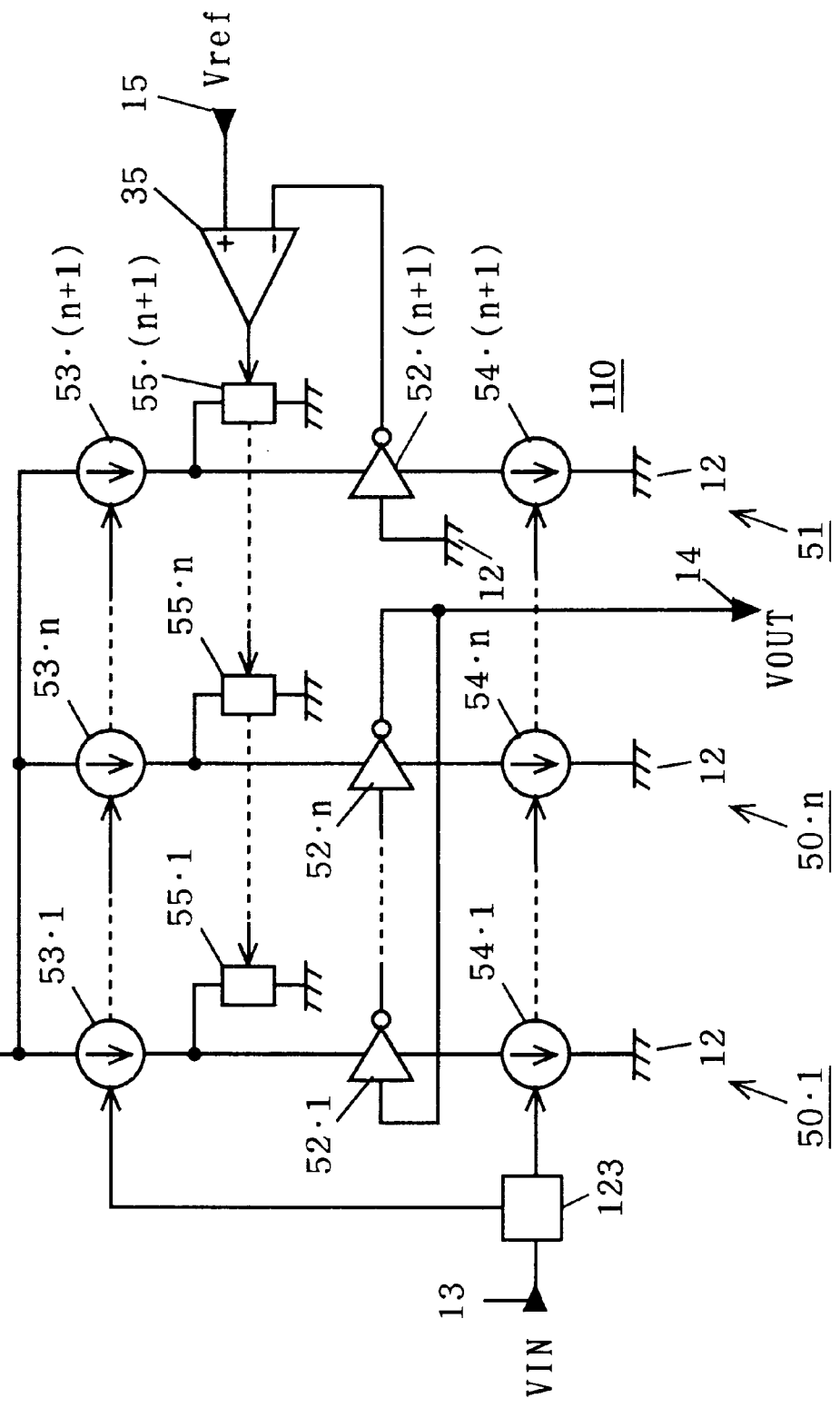
FIG. 17 is a circuit diagram showing a VCO as a variant.

The features of the present invention illustrated by the VCOs 101 to 109 can be represented in the form which is more general. FIG. 17 is a circuit diagram showing the form in which the VCO 101 is extended as an example. In a VCO 110, the current controlled delay circuits 26.1 to n are extended to current controlled delay circuits 50.1 to n, and the replica circuit 36 is extended to a replica circuit 51.

A current controlled delay circuit 50.k (k=1 to n) is provided with an inverter 52.k which is the general form of the inverter 20.k, a high potential side current source 53.k which is obtained by extending the PMOS 21.k and supplies a current to the inverter 52.k, and a low potential side current source 54.k which is obtained by extending the NMOS 25.k. Inverters 52.1 to n are cascade-connected cyclically. The output of one of the inverters 52.1 to n (the output of the inverter 52.n in FIG. 17) is connected to an output terminal 14 for fetching a clock signal VOUT to the outside.

The replica circuit 51 has the same structure as that of the current controlled delay circuit 50.k, and includes a current source 53.(n+1) having the same structure as that of the current source 53.k, an inverter 52.(n+1) having the same structure as that of the inverter 52.k, and a current source 54.(n+1) having the same structure as that of the current source 54.k. The input of the inverter 52.(n+1) is connected to a ground side power line 12.

A current control circuit 123 is connected to the current sources 53.1 to (n+1) and 54.1 to (n+1). The current control circuit 123 supplies a control signal which corresponds to an input voltage signal VIN inputted through an input terminal 13, to the current sources 53.1 to (n+1) and 54.1 to (n+1). As a result, the current sources 53.1 to (n+1) and 54.1 to (n+1) supply, to the inverters 52.1 to (n+1), a current having a magnitude which corresponds to the input voltage signal VIN. Accordingly, the frequency of the clock signal VOUT is changed according to the input voltage signal VIN.

One of the ends of a bypass circuit 55.m which is the general form of the PMOS 23.m is connected to the connecting portion of a current source 53.m and an inverter 52.m. The other end of the bypass circuit 55.m is connected to the ground side power line 12. Consequently, the bypass circuit 55.m functions to bypass a main current which flows in the current source 53.m to the ground side power line 12.

The output of a differential amplifier 35 is connected to bypass circuits 55.1 to (n+1) in common. The differential amplifier 35 has one of inputs connected to the output of the inverter 52.(n+1), and the other input connected to a reference potential input terminal 15 through which a reference potential Vref passes.

Figure 18:
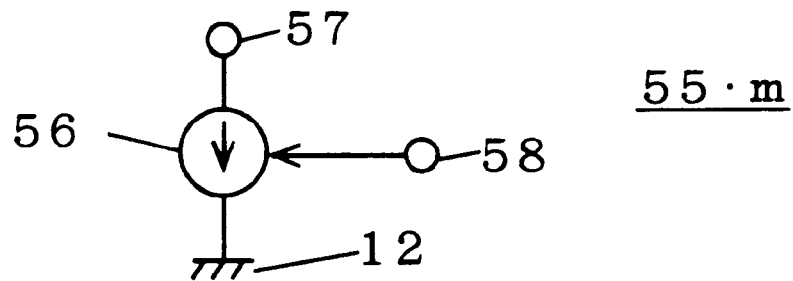
FIG. 18 is a circuit diagram showing a bypass circuit 55.m as a variant.

The bypass circuit 55.m can be represented equivalently in a circuit diagram of FIG. 18. More specifically, a current source 56 is provided between the ground side power line 12 and a terminal 57 connected to the connecting portion of the current source 53.m and the inverter 52.m (that is, the power input end of the inverter 52.m). The current source 56 turns on and off a current according to the output of the differential amplifier 35 which is inputted through a terminal 58. If the potential of the output of the inverter 52.(n+1) which is inputted to the differential amplifier 35 is lower than the reference potential Vref, the current source 56 is brought into the OFF state (in which the current does not flow). If the potential of the output of the inverter 52.(n+1) is higher than the reference potential Vref, the current source 56 is brought into the ON state (the conductive state).

Figure 19:
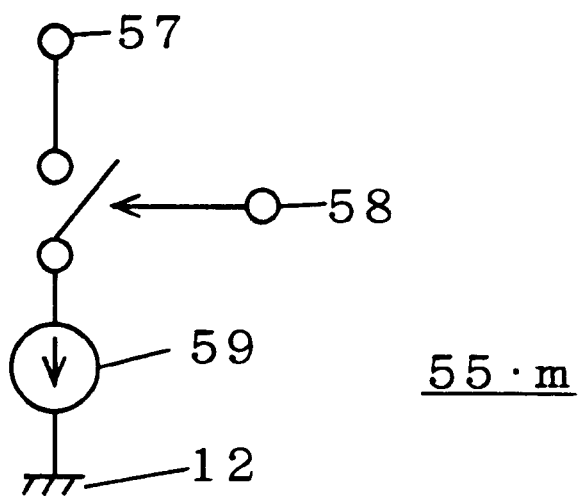
FIG. 19 is a circuit diagram showing the bypass circuit 55.m as a variant.

The bypass circuit 55.m which operates as described above can also be represented in a circuit diagram of FIG. 19. More specifically, a serial circuit in which a current source 59 and a switch are connected in series is provided between the terminal 57 and the ground side power line 12. If the potential of the output of the inverter 52.(n+1) which is inputted to the differential amplifier 35 is lower than the reference potential Vref, the switch is brought into the OFF state. If the potential of the output of the inverter 52.(n+1) is higher than the reference potential Vref, the switch is brought into the ON state. As shown in FIGS. 18 and 19, the current source 56 or 59 bypasses a current supplied by the current source 53.m to the ground side power line 12 when it is turned on.

Thus, the output of the inverter 52.(n+1) is held to have the same value as that of the reference potential Vref by the operation of the negative feedback loop formed by the differential amplifier 35 and the bypass circuit 55.(n+1). The bypass circuits 55.1 to n also operate in the same manner as the bypass circuit 55.(n+1). Consequently, the high level outputs of the inverters 52.1 to n are held to have the value of the reference potential Vref irrespective of the potential of a high potential side power line 11. As a result, it is possible to suppress the period jitter of the clock signal VOUT.

As described above, the VCO 101 can be extended to the VCO 110 which is more general. In the same manner as in the VCO 101, furthermore, it is possible to obtain the effect that the period jitter of the clock signal VOUT is suppressed. Similarly, the VCOs 102 to 109 can be extended to the general form. The VCOs 101 to 109 have the best form because they are provided with the smallest number of elements, contribute to the miniaturization of a device and can be manufactured easily.

<8. Seventh Embodiment>

A voltage controlled oscillator according to a seventh embodiment will be described below.

<8-1. Second Factor of Period Jitter>

As described in the above embodiments and variants, the high level potential of the clock signal VOUT is kept constant even if the potential of the high potential side power line 11 fluctuates in the VCOs 101 to 110. As a result, a transition width of the clock signal VOUT (a level difference between the low level and the high level) is kept constant. Consequently, it is possible to obtain the effect of suppressing a period jitter in the clock signal VOUT, which cannot be obtained in the device 151 according to the prior art.

In the VCOs 101 to 110, the high level potential of the clock signal VOUT is not affected by the fluctuation of the potential of the high potential side power line 11 but the transition time of the clock signal VOUT is more or less affected. FIG. 20 is a graph typically showing the waveform of the clock signal VOUT obtained when the inverters 20.1 to 20.n are cascade-connected cyclically in five stages (that is, n=5) in the VCO 101 (FIG. 1).

As shown in FIG. 20, even if a potential VDD of the high potential side power line 11 fluctuates, the high level potential of the clock signal VOUT is held at a reference potential Vref having a constant value. Accordingly, it is possible to prevent the period jitter from being caused by the fluctuation of the transition width of the clock signal VOUT. However, a time necessary for a transition from one of the levels of the clock signal VOUT to the other level thereof, that is, a transition time during fall from the high level to the low level fluctuates a little.

More specifically, a transition time Td2 taken during the fall of the clock signal VOUT when the potential VDD is low is greater than a transition time Td1 taken during the fall of the clock signal VOUT when the potential VDD is high. As a result, a cycle T2 obtained when the potential VDD is low is greater than a cycle T1 obtained when the potential VDD is high. In other words, the fluctuation of the transition time with the change in the potential VDD of the high potential side power line 11 functions as a second factor of a period jitter in the clock signal VOUT so that the period jitter slightly remains. The transition time taken from the low level to the high level is affected by the fluctuation of the potential VDD with difficulty and is comparatively stable.

The fluctuation of the transition time is caused by the following mechanism. In the VCO 101 shown in FIG. 1, a channel modulation effect usually appears on the PMOS 27 provided in the current control circuit 121 in the same manner as in other MOSs. More specifically, even if a gate voltage (source–gate voltage) is constant, a drain current in a saturation region is slightly increased/decreased with an increase/a decrease in the source–drain voltage.

When the potential VDD is increased, the magnitudes of currents flowing in the PMOS 27 and the NMOS 29 are increased by the channel modulation effect in the PMOS 27. As a result, the magnitude of a current flowing in a PMOS 21.m which forms a current mirror circuit together with the PMOS 27 is also increased. Similarly, the magnitude of a current flowing in an NMOS 25.m which forms a current mirror circuit together with the NMOS 29 is also increased.

Even if the magnitude of the current flowing in the PMOS 21.m is increased, the increase is mainly split into a PMOS 23.m so that a current flowing in a PMOS 22.m is rarely affected. In other words, a (positive) source current supplied from the high potential side power line 11 to an inverter 20.m does not fluctuate noticeably. Accordingly, the transition time taken during rise of the clock signal VOUT which corresponds to an output of the inverter 20.m is kept almost constant.

On the other hand, if the magnitude of the current flowing in the NMOS 25.m is increased, all the increase is given to an NMOS 24.m. More specifically, a (negative) source current supplied from a ground side power line 12 to the inverter 20.m (a so-called "drawn current" which is drawn from the inverter 20.m into the high potential side power line 11) is increased corresponding to an increase in the current flowing in the NMOS 25.m. As a result, the transition time taken during the fall of the clock signal VOUT is shortened.

Conversely, when the potential VDD is lowered, the magnitude of the current flowing in the PMOS 27 and the NMOS 29 is reduced. As a result, the transition time taken during the fall of the clock signal VOUT is increased. In the same manner as in the case where the potential VDD is high, the transition time taken during the rise of the clock signal VOUT is not influenced noticeably. According to the above-mentioned mechanism, the period jitter appears due to the second factor as shown in FIG. 20.

<8-2. Structure and Operation of Device>

Figure 21:
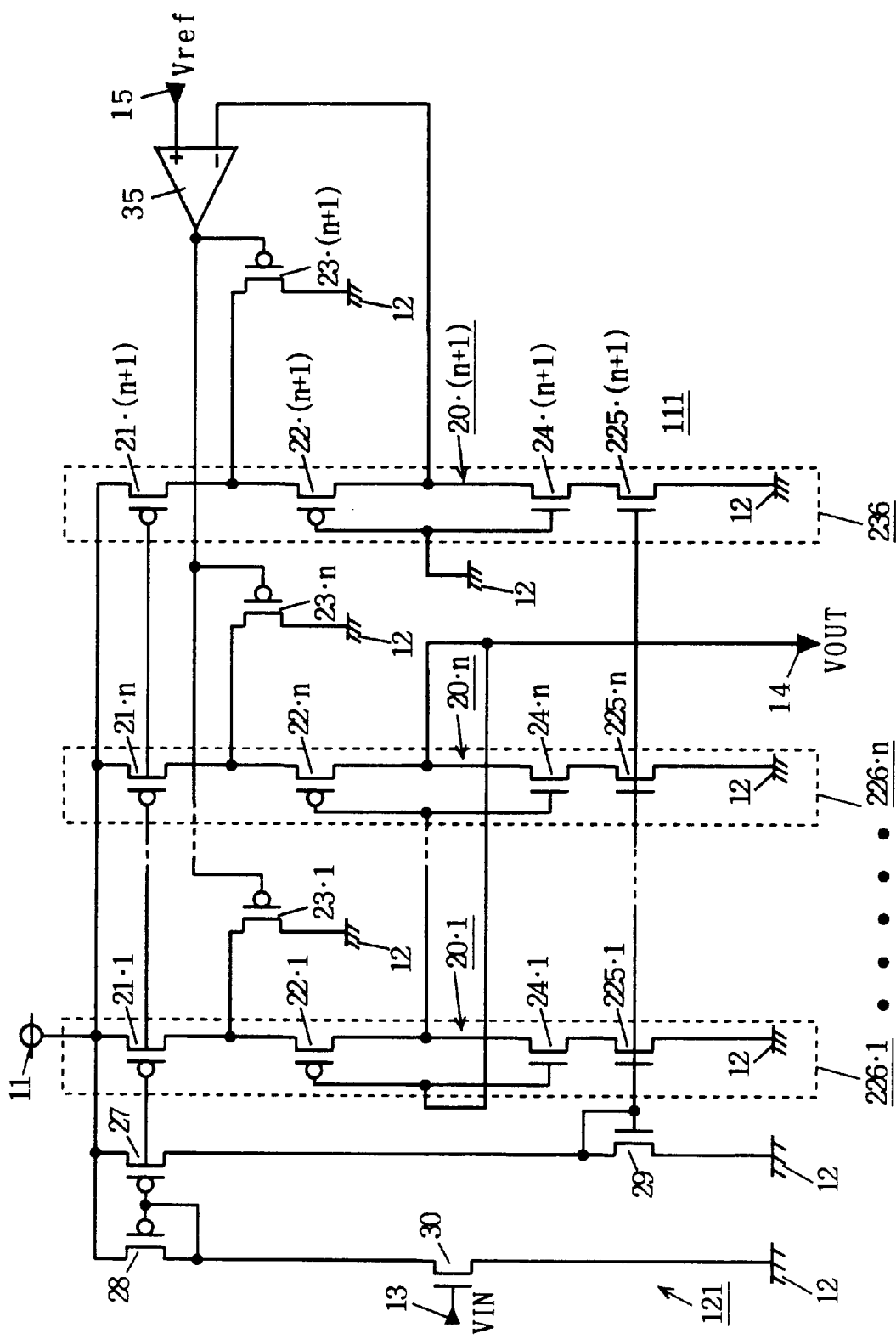
FIG. 21 is a circuit diagram showing a VCO according to a seventh embodiment of the present invention.

FIG. 21 is a circuit diagram showing the structure of a VCO formed such that the period jitter can also be prevented from being caused by the above-mentioned second factor. A VCO 111 is characteristically different from the VCO 101 (FIG. 1) in that a channel width of an NMOS 225.m is set in such a manner that the magnitude of a main current flowing in the NMOS 225.m which corresponds to a current source on a low potential side for supplying a (negative) source current to an inverter 20.m is greater than that of a main current flowing in a PMOS 21.m which corresponds to a current source on a high potential side.

An inverter 20.k, and a PMOS 21.k and an NMOS 225.k which function as current sources of the inverter 20.k form a current controlled delay circuit 226.k. Similarly, an inverter 20.(n+1), and a PMOS 21.(n+1) and an NMOS 225.(n+1) which function as current sources of the inverter 20.(n+1) form a replica circuit 236.

Referring to an NMOS and a PMOS which are built in the same semiconductor substrate, a current equivalent channel width, that is, a channel width having the same magnitude of a main current, is about twice as much in the NMOS as in the PMOS. The channel width of the NMOS 225.m exceeds a value equivalent in main current to the PMOS 21.m, that is, exceeds a value which is about twice as much as a channel width of the PMOS 21.m. For this reason, a transition time taken during fall of the clock signal VOUT is smaller than a transition time taken during rise thereof.

Figure 22:
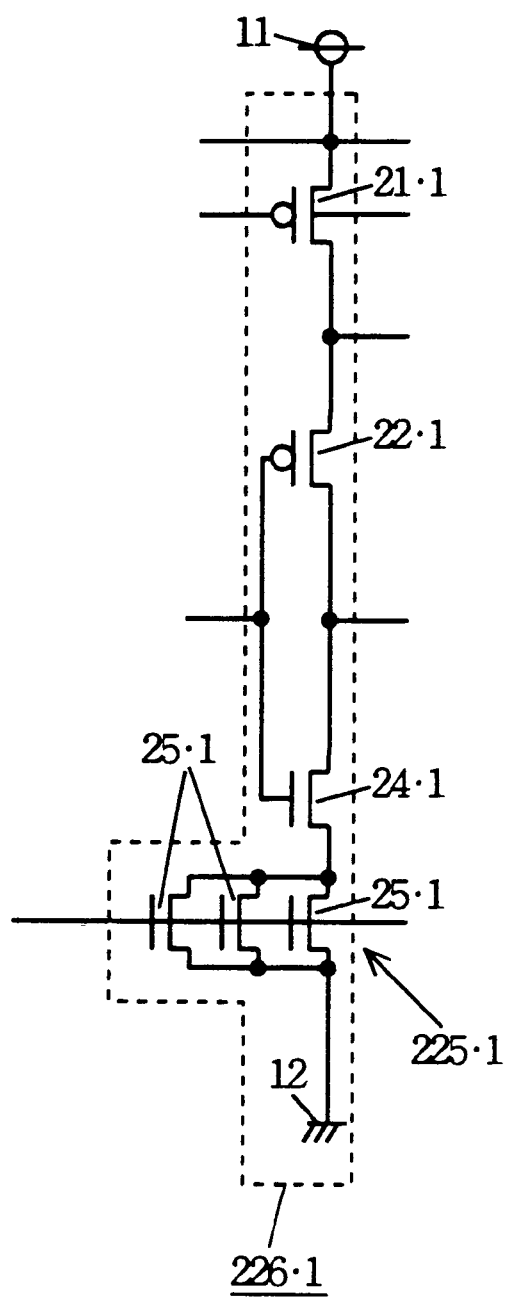
FIG. 22 is a circuit diagram showing a current controlled delay circuit 226.1 according to the seventh embodiment of the present invention.

FIG. 22 is a circuit diagram showing a current controlled delay circuit 226.1 and is representative of the preferred structures of the current controlled delay circuits 226.1 to n and the replica circuit 236. As shown in FIG. 22, it is desirable that an NMOS 225.1 should be formed as a circuit having a plurality of NMOSs 25.1 connected in parallel. Each of the NMOSs 25.1 has a channel width equivalent in current to the PMOS 21.m.

Thus, the NMOS 225.1 is formed as a circuit in which a plurality of NMOSs 25.1, each having the channel width equivalent in current to the PMOS 21.m, are connected in parallel. Consequently, a manufacturing process such as a layout step or the like can be performed easily, keeping the channel width highly precise. In the example of FIG. 22, the NMOS 225.1 is formed by three NMOSs 25.1. Therefore, the magnitude of a main current flowing in the NMOS 225.1 is three times as much as that of a main current flowing in a PMOS 21.1.

Figure 23:
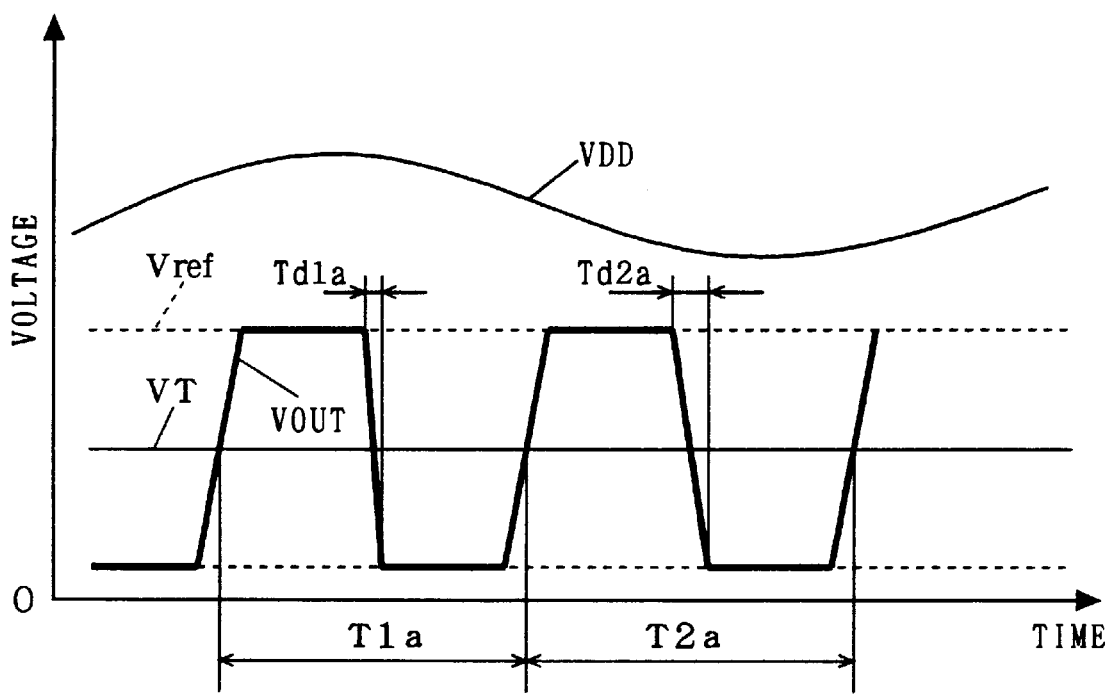
FIG. 23 is a graph showing the operation of the VCO according to the seventh embodiment of the present invention.

FIG. 23 is a graph showing the waveform of the clock signal VOUT obtained when the inverters 20.1 to 20.n are cascade-connected cyclically in five stages (that is, n=5) in the VCO 111. As shown in FIG. 23, a transition time taken during the fall of the clock signal VOUT is smaller than the transition time taken during the rise thereof. For this reason, even if transition times Td1a and Td2a fluctuate with the change of the potential VDD of the high potential side power line 11, cycles T1a and T2a do not greatly fluctuate.

More specifically, the transition time taken during the fall having the great fluctuation is set smaller than that taken during the rise which is comparatively stable with the change of the potential VDD. Therefore, cycles which are equivalent to times obtained by adding both transition times to periods that are stabilized at the high and low levels do not greatly fluctuate with the change of the potential VDD.

In the VCO 111, thus, the magnitude of the (negative) source current supplied from the current source 25.m provided on the low potential side of the inverter 20.m is set greater than that of the (positive) source current supplied from the current source 21.m provided on the high potential side. Therefore, it is possible to suppress a period jitter caused by the fluctuation of the transition time of the clock signal VOUT as the second factor as well as the period jitter caused by the fluctuation of the high level potential of the clock signal VOUT as the first factor.

<8-3. Optimization of Ratio of Source Current>

In the VCO 111, if the number (that is, "n") of the inverters 20.1 to 20.n which are cascade-connected cyclically is several, for example, and is not set sufficiently great, the effect of suppressing the period jitter cannot fully be obtained in some cases where a ratio of the current equivalent channel widths between the PMOS 21.m and the NMOS 25.m, that is, a ratio of the magnitudes of the source currents supplied from the current sources on the high and low potential sides of the inverter 20.m is caused to exceed a limit. In consideration of this problem, an optimal range of a value "n" will be described below.

Figure 24:
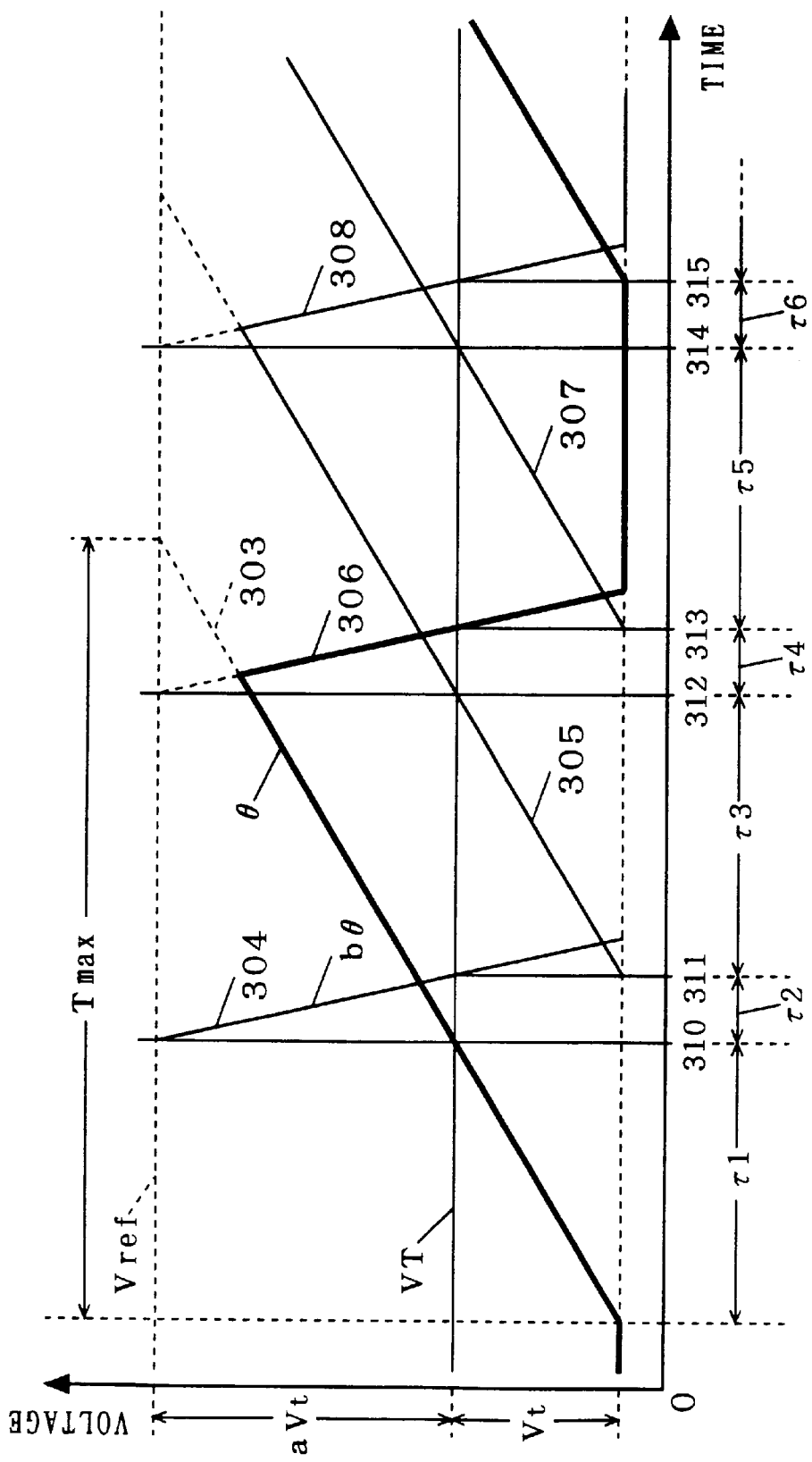
FIG. 24 is a graph showing the operation of the VCO according to the seventh embodiment of the present invention.

FIG. 24 is a graph typically showing the waveform of outputs of the inverters 20.1 to 20.3 in the VCO 111 in which n=3 is set. At a certain time, the low level output of the inverter 20.1 starts rise along a straight line 303. In the process of a transition along the straight line 303, the output of the inverter 20.1 intersects a threshold voltage VT of the inverter 20.2 on the next stage at a time 310. As a result, the high level output of the inverter 20.2 starts fall along a straight line 304 at the time 310.

In the process of a transition along the straight line 304, the output of the inverter 20.2 intersects the threshold voltage VT of the inverter 20.3 on the next stage at a time 311. As a result, the low level output of the inverter 20.3 starts rise along a straight line 305 at the time 311.

In the process of a transition along the straight line 305, the output of the inverter 20.3 intersects the threshold voltage VT of the inverter 20.1 on the next stage at a time 312. If it has reached the high level at the time 312, the output of the inverter 20.1 starts fall at the time 312. However, in the process where the output of the inverter 20.1 is rising at the time 312 as shown in FIG. 24, the output of the inverter 20.1 is not immediately changed to fall at the time 312 but starts the fall along a straight line 306 at the time when it intersects the straight line 306 in which the time 312 acts as a starting point for the fall.

In the process where the output of the inverter 20.1 transits along the straight line 306, the output of the inverter 20.2 starts rise along a straight line 307 at the time 313 when the output of the inverter 20.1 intersects the threshold voltage VT of the inverter 20.2 on the next stage. At the time when the straight line 305 intersects a straight line 308 using, as a starting point, a time 314 when the output of the inverter 20.2 intersects the threshold voltage VT of the inverter 20.3 on the next stage, the output of the inverter 20.3 is changed from the rise to the fall. In the process where the output of the inverter 20.3 transits along the straight line 308, the output of the inverter 20.1 starts the rise again at a time 315 when the output of the inverter 20.3 intersects the threshold voltage VT of the inverter 20.1 on the next stage.

As described above, the output of the inverter 20.1 transits along the straight lines 303 and 306 intersecting each other as shown in a thick polygonal line, and so do the outputs of the inverters 20.2 and 20.3. More specifically, the outputs of the inverters 20.1 to 20.3 are changed from the rise to the fall before they reach the high level. This is derived from the fact that the transition times taken during the fall of the outputs of the inverters 20.1 to 20.3 are set excessively small though the number "n" is set smaller, for example, to "3".

Figure 25:
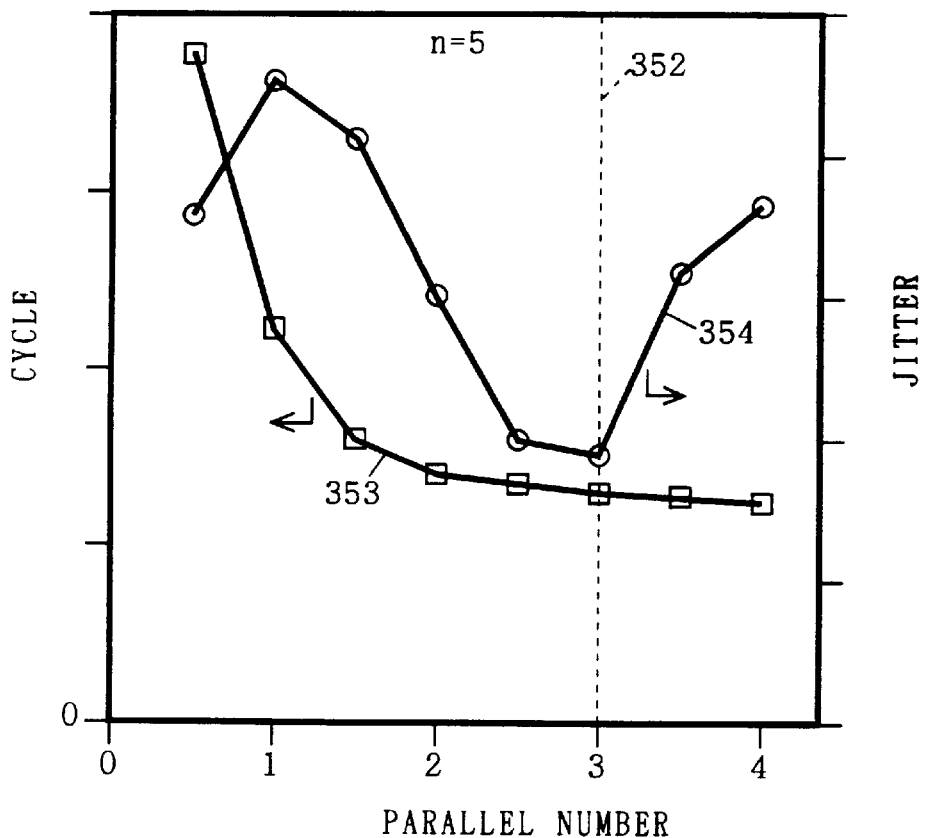
FIG. 25 is a graph showing the operation of the VCO according to the seventh embodiment of the present invention.

As a result, the amplitude of the clock signal VOUT cannot be obtained as a set magnitude. Furthermore, this results in a decrease in the effect that the period jitter can be reduced by keeping the high level potential of the clock signal VOUT constant. FIG. 25 is a graph indicating results of an experiment performed to ascertain the foregoing. More specifically, FIG. 25 is a graph indicating results of an experiment on the change of the magnitude of the period jitter and a cycle of the clock signal VOUT obtained by varying the number (parallel number) of the NMOSs 25.m connected in parallel as shown in FIG. 22 in the VCO 111 set to n=5. In FIG. 25, a curve 353 represents the cycle versus the parallel number, and a curve 354 represents the period jitter versus the parallel number.

As shown in FIG. 25, as the parallel number is increased, the cycle is decreased. On the other hand, if the parallel number is equal to or smaller than "3", the magnitude of the period jitter is decreased with the parallel number. It is demonstrated that the period jitter can be reduced by shortening the transition time taken during the fall of the clock signal VOUT.

However, if the parallel number is greater than "3", the change of the period jitter with the parallel number is converted from a decrease to an increase. Consequently, it is demonstrated that the effect of reducing the period jitter is decreased if the parallel number is excessively increased as described with reference to FIG. 24. In a VCO which is an experimental object, it is desirable that the parallel number, that is, a ratio of the magnitude of the source current supplied from the current source on the low potential side of the inverter 20.m to that of the source current supplied from the current source on the high potential side thereof (hereinafter referred to as a "source current ratio") should be set as high as possible within a range of 3 or less.

Next, an optimal range of the source current ratio in a general VCO in which n inverters are cascade-connected cyclically will be described below. Since the number "n" is an odd number which is equal to or greater than 3, it can be expressed by using a natural number "k" (k=1,2,3, . . . ) in Equation 1.

$$n=2k+1 \qquad \text{(Equation 1)}$$

As illustrated in FIG. 24, generally, a rise speed of the output of the inverter (an increase rate of the output) can be represented by θ, a fall speed of the output (a decrease rate of the output) can be represented by b θ, a potential difference between the threshold voltage VT and the low level output can be represented by Vt, and a potential difference between the high level output and the threshold voltage VT can be represented by aVt. A ratio "b" of the decrease rate of the output to the increase rate thereof corresponds to the above-mentioned source current ratio. In the example of FIG. 24, the increase rate θ and the decrease rate b θ correspond to gradients of the straight line 303 (, 305, 307) and the straight line 304 (, 306, 308), respectively.

As illustrated in FIG. 24, τ1 indicates a period from a time when the output of an inverter on a stage (for example, a first stage) intersects the threshold voltage VT during a decrease to a time when the output of an inverter on a second stage intersects the threshold voltage VT during an increase. Similarly, τ2 indicates a period from a time when the output of the inverter on the second stage intersects the threshold voltage VT during an increase to a time when the output of an inverter on a third stage intersects the threshold voltage VT during a decrease. In the same manner, periods τ3, τ4, . . . τ (2k+1) are defined. From the above definition, a group of periods τ1, τ3, . . . τ (2k+1) and that of periods τ2, τ4, . . . , τ (2k) are calculated by Equations 2 and 3, respectively.

$$\tau 1 = \tau 3 = \cdots = \tau(2k+1) = \frac{Vt}{\theta} \qquad \text{(Equation 2)}$$

$$\tau 2 = \tau 4 = \cdots = \tau(2k) = \frac{aVt}{b\theta} \qquad \text{(Equation 3)}$$

Furthermore, a time t (n) taken for a signal to turn around n inverters, if it is defined by Equation 4, is calculated by Equation 5.

$$t(n) = \sum_{i=1}^{n} \tau(i) \qquad \text{(Equation 4)}$$

-continued $$t(n) = \sum_{i=1}^{n} \tau(i) = \sum_{i=1}^{2k+1} \tau(i) \quad \text{(Equation 5)}$$
$$= \frac{Vt}{\theta} + \frac{aVt}{b\theta} + \frac{Vt}{\theta} + \cdots + \frac{aVt}{b\theta} + \frac{Vt}{\theta}$$
$$= (k+1)\frac{Vt}{\theta} + k \cdot \frac{aVt}{b\theta}$$

A transition time taken during the rise of the output of one inverter (hereinafter referred to as a "rise transition time"), that is, a period from a start of the rise of the output to a time when the output sufficiently reaches the high level potential is expressed as Tmax. In the example of FIG. 24, the rise transition time Tmax corresponds to a time taken from a starting point of the straight line 303 (, 305, 307) to an end point thereof.

In order for the amplitude of the output of the inverter to have a set magnitude, a relationship of Equation 6 between the rise transition time Tmax and the time t (n) is the necessary and sufficient condition.

$$T\max \le t(n) = (k+1)\frac{Vt}{\theta} + k \cdot \frac{aVt}{b\theta} \quad \text{(Equation 6)}$$

This relationship is expressed by Equation 7 in the example of n=3 shown in FIG. 24.

$$T\max \le t(3) = \tau 1 + \tau 2 + \tau 3 = 2\frac{Vt}{\theta} + \frac{aVt}{b\theta} \quad \text{(Equation 7)}$$

As is apparent from the Equation 6, an upper limit is given to the source current ratio "b" in order to obtain the set amplitude for the output of the inverter, that is, the clock signal VOUT, and to sufficiently obtain the effect of suppressing the period jitter. In addition, a lower limit is given to the number "n" of the inverters which are cascade-connected cyclically.

The foregoing is made clearer if the rise transition time Tmax is represented by a variable such as a potential difference Vt or the like. As illustrated in FIG. 24, the rise transition time Tmax is calculated by Equation 8 if transition characteristics of the output of the inverter can be expressed by a straight line with high precision from one level to another level. In this case, the relationship of the Equation 6 can be replaced with that of Equation 9. Furthermore, this relationship is equivalent to that of Equation 10.

$$T\max = \frac{(a+1)Vt}{\theta} \quad \text{(Equation 8)}$$
$$(a+1)\frac{Vt}{\theta} \le (k+1) \cdot \frac{Vt}{\theta} + \frac{ka}{b} \cdot \frac{Vt}{\theta} \quad \text{(Equation 9)}$$
$$\frac{1}{b} \ge \frac{a-k}{ka} \quad \text{(Equation 10)}$$

As expressed by the Equation 10, if a natural number "k" related to the number "n" of the inverters is smaller than a variable "a", an upper limit determined by the number "n" and the variable "a" is given to the source current ratio "b". In other words, it is understood that the source current ratio "b" has the upper limit in order to sufficiently obtain the effect of suppressing the period jitter if the number "n" of the inverters cascade-connected cyclically is smaller than a value determined by the variable "a". Conversely, if the number "n" of the inverters is equal to or greater than the value determined by the variable "a", the source current ratio "b" has no upper limit.

Figure 26:
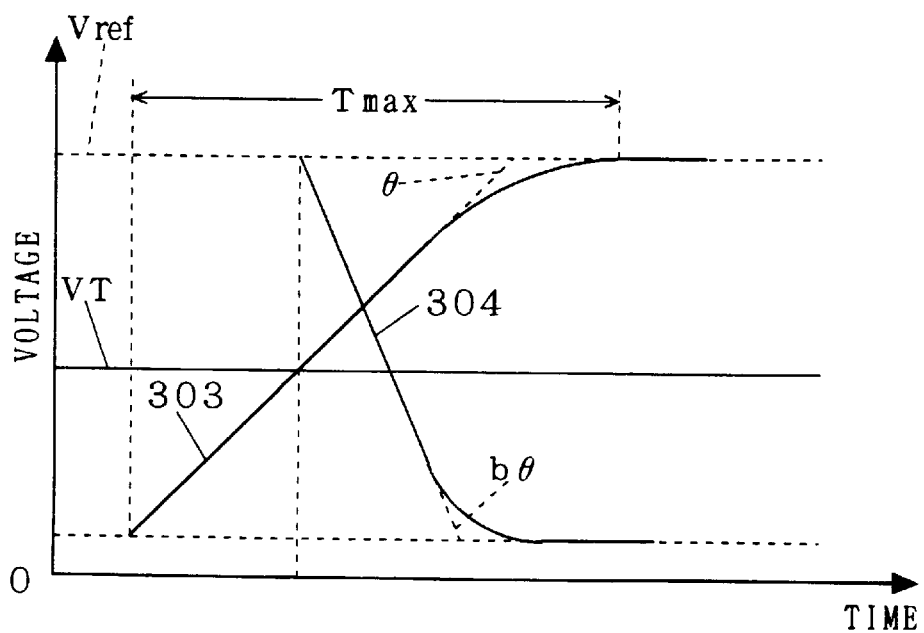
FIG. 26 is a graph showing the operation of the VCO according to the seventh embodiment of the present invention.

The transition characteristics of the output of the inverter cannot always be expressed with high precision by the straight lines shown in FIG. 24. FIG. 26 is a graph typically showing transition characteristics which are widely obtained from usual inverters. More specifically, the output does not reach a target level straight but asymptotically in a final stage of transition.

Figure 27:
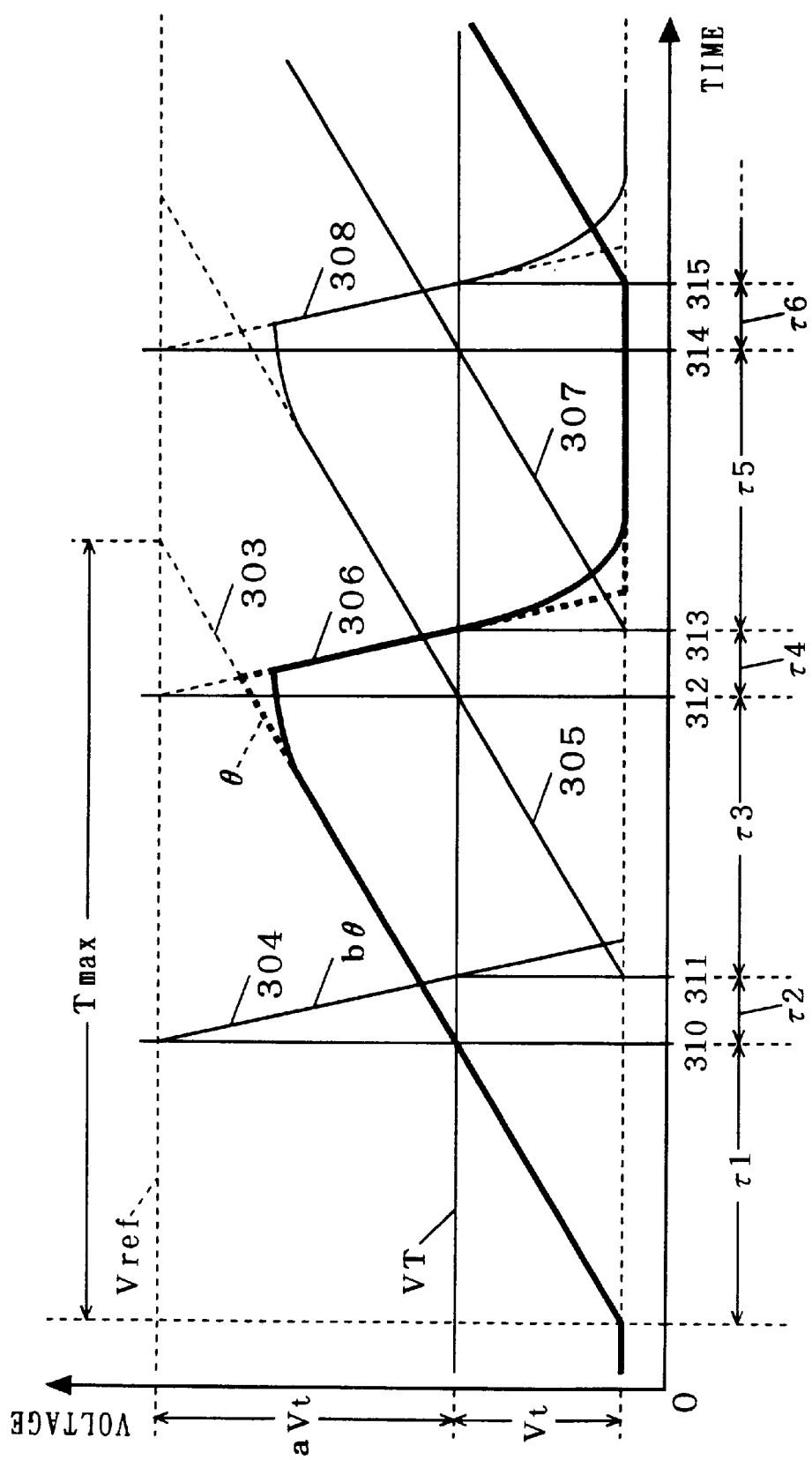
FIG. 27 is a graph showing the operation of the VCO according to the seventh embodiment of the present invention.

However, the output transits along the lines 303 and 304 within a range from a start of the transition to a middle thereof. Within this range, straight approximation is sufficiently established with high precision for the transition characteristics. Accordingly, the waveform of the output of each inverter is shown by a graph of FIG. 27. As is apparent from FIG. 27, the relationships of the Equations 2 and 3 about the periods τ1, τ2, . . . , τ (2k+1) can sufficiently be established with high precision.

As shown in FIG. 26, the rise transition time Tmax is generally defined as a period from a time when the rise of the output is started to a time when the target high level is reached. Consequently, the Equation 6 can exactly be established. In some cases, the time when the output reaches the high level is not always obvious due to the asymptotic characteristics. Therefore, it is preferable that a time when the output is judged to sufficiently approach the high level should be defined as a reference from the viewpoint of utility.

While an example in which the NMOS 25.m is replaced with the NMOS 225.m in the VCO 101 (FIG. 1) has been shown in FIG. 21, the same replacement is applied to the VCOs according to other embodiments so that it is also possible to obtain the effect of suppressing the period jitter caused by the second factor. In general, if the source current of the current source 54.m is set greater than that of the current source 53.m (preferably, within the range of the Equation 6) in the VCO 110 (FIG. 17), the same effect can be obtained.

<9. Eighth Embodiment>

Figure 28:
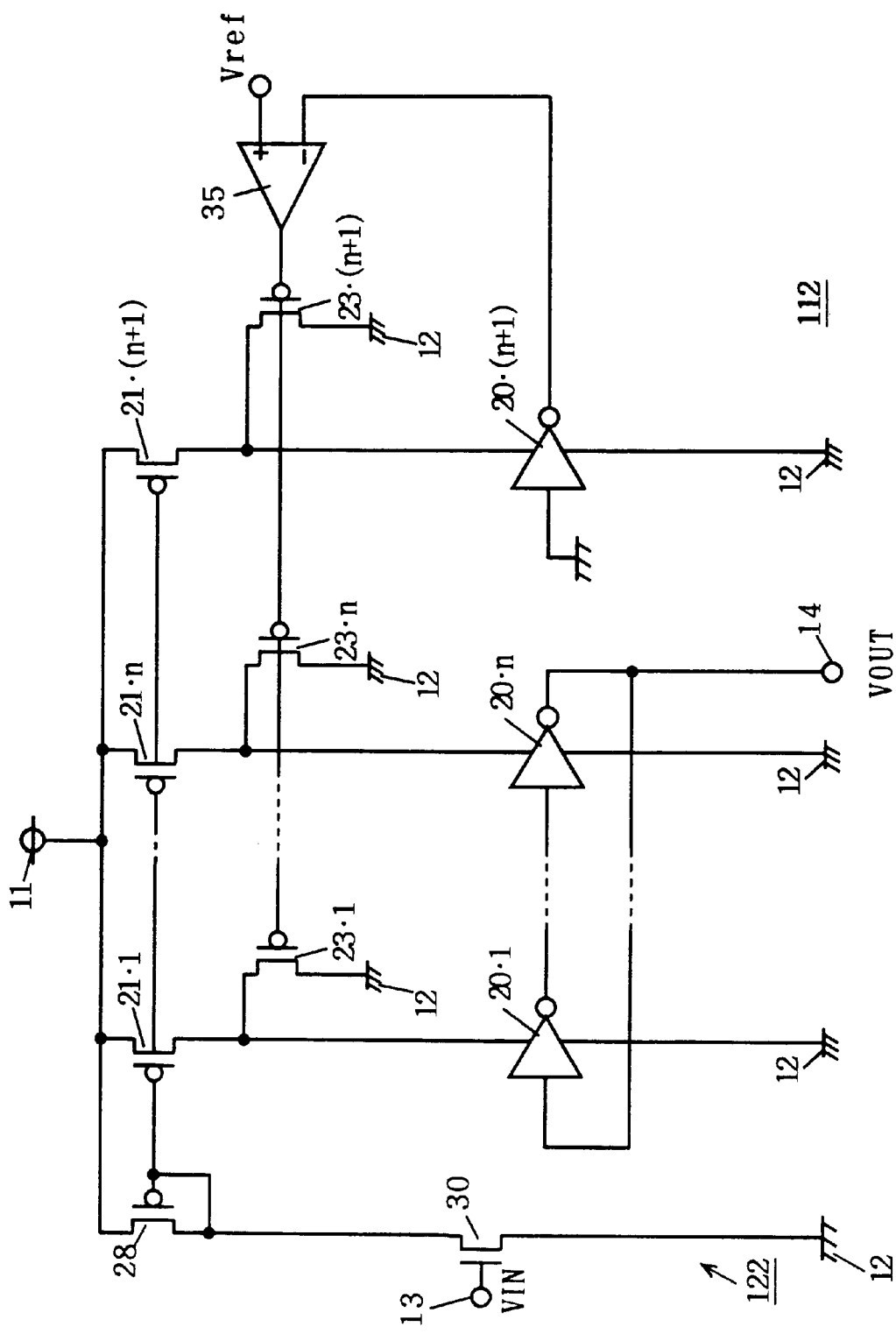
FIG. 28 is a circuit diagram showing a VCO according to an eighth embodiment of the present invention.
Figure 29:
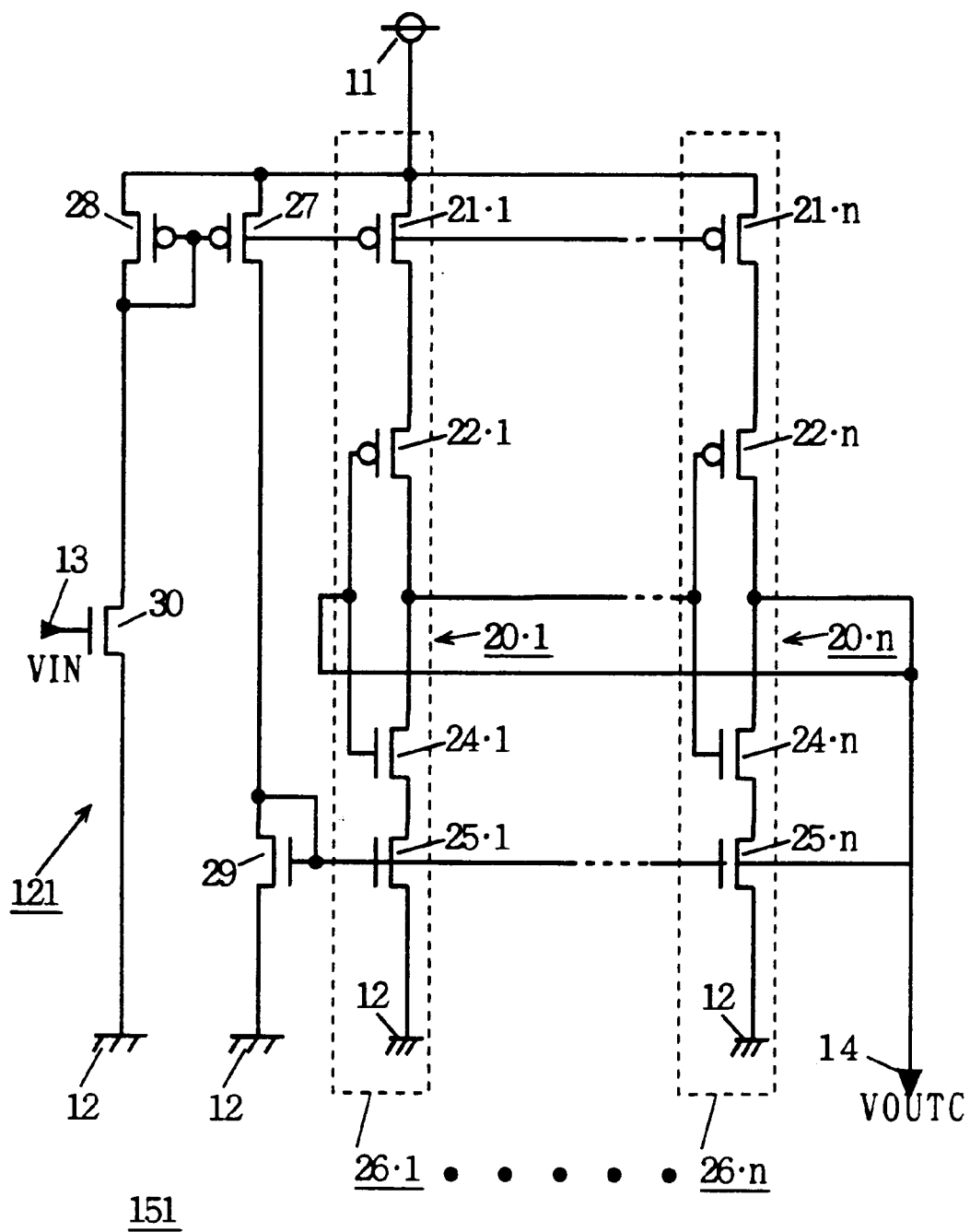
FIG. 29 is a circuit diagram showing a VCO according to the prior art.

FIG. 28 is a circuit diagram showing a structure of a VCO according to an eighth embodiment. A VCO 112 is characteristically different from the VCO 111 (FIG. 21) in that the NMOS 225.m acting as a current source on the low potential side for supplying a (negative) source current to the inverter 20.m is removed and the inverter 20.m and the ground side power line 12 are short-circuited. Additionally, the current control circuit 121 (FIG. 21) is replaced with the current control circuit 122 (FIG. 9).

Since the inverter 20.m and the ground side power line 12 are short-circuited, the VCO 112 ideally functions equally to a VCO in which a source current supplied from a current source on the low potential side is set infinite. More specifically, a source current ratio "b" is sufficiently high and a transition time taken during fall of the output of the inverter is fully close to zero.

When the number "n" of the inverters which are cascade-connected cyclically is fully great, or a threshold voltage VT is sufficiently high (that is, a variable "a" is sufficiently low), the condition of the Equation 6 can be met even if the source current ratio "b" is set great without limit. Accordingly, the VCO 112 is suitable for use on the condition that the number "n" or the threshold voltage VT is set sufficiently great. It is apparent that the inverter 20.m can be replaced with the general inverter 52.m shown in FIG. 17.

In the VCO 112, a current source on the low potential side such as the NMOS 225.m does not need to be provided and a structure of the current control circuit 122 can also be simplified. In other words, the number of elements can be reduced in the VCO 112. Consequently, the size of the device can be reduced and the cost of a manufacturing process such as a design step or the like can be cut down.

<10. Variant of Eighth Embodiment>

In the VCO 112, a resistive element may be provided between the inverter 20.m (generally, the inverter 52.m) and the ground side power line 12 instead of being short-circuited. In this case, it is preferable that the magnitude of a resistance of the resistive element should be set in such a manner that the source current ratio "b" is greater than a value "1". In the VCO having such a structure, the condition of the Equation 6 can always be met by properly selecting the magnitude of the resistance of the resistive element.

While the invention has been described in detail, the foregoing description is in all aspects illustrative and not restrictive. It is understood that numerous other modifications and variations can be devised without departing from the scope of the invention.

We claim:

1. A voltage controlled oscillator in which the frequency of an output signal is variable according to an input voltage signal, comprising:

first to nth (n is an odd number) inverters which are cascade-connected cyclically and have the same structures;

an (n+1)th inverter which has the same structure as that of each of the first to nth inverters and has an input connected to one of power lines;

first to (n+1)th current sources which have the same structures, are provided between the other power line and power input ends of said first to (n+1)th inverters respectively, and supply, to said first to (n+1)th inverters respectively, a current having a magnitude which corresponds to a control signal;

a current control circuit for supplying said control signal to said first to (n+1)th current sources according to said input voltage signal;

first to (n+1)th bypass circuits which have the same structures, are provided between respective said power input ends of said first to (n+1)th inverters and said one of power lines, and are conducted to bypass currents of said first to (n+1)th current sources;

a bypass control circuit which holds a potential difference between an output of said (n+1)th inverter and said one of power lines to have a predetermined value which is set smaller than a voltage between said one of power lines and said other power line by making said first to (n+1)th bypass circuits conductive when said potential difference exceeds said predetermined value; and wherein said one of power lines and respective other power input ends of said first to (n+1)th inverters are connected to each other in such a manner that a source current ratio of a magnitude of a current flowing therein to a magnitude of a current supplied from each of said first to (n+1)th current sources exceeds a value "1".

2. The voltage controlled oscillator as defined in claim 1, wherein said bypass control circuit includes a differential amplifier, and wherein each of said first to (n+1)th bypass circuits includes a switching element which is turned on and off in response to an output of said differential amplifier, said differential amplifier serving to amplify a difference between said output of said (n+1)th inverter and a reference potential having a constant magnitude for said one of power lines.

3. The voltage controlled oscillator as defined in claim 1, wherein said bypass control circuit includes a differential amplifier, and wherein each of said first to (n+1)th bypass circuits includes a switching element which is turned on and off in response to an output of said differential amplifier, said differential amplifier serving to amplify a difference between the potential of said power input end of said (n+1)th inverter and a reference potential having a constant magnitude for said one of power lines.

4. The voltage controlled oscillator as defined in claim 2, wherein said switching element is a transistor element.

5. The voltage controlled oscillator as defined in claim 4, each of said first to (n+1)th bypass circuits including:

another transistor element which is connected to said transistor element in series; and a driving portion for turning on said another transistor element when an output of corresponding one of said first to (n+1)th inverters exceeds a value with which said transistor is turned on and further approaches said predetermined value.

6. The voltage controlled oscillator as defined in claim 5, wherein said driving portion is an inverter in which a single transistor and a plurality of transistors that are complementary to said single transistor and connected to one another in parallel are connected in series so that a threshold voltage which is a reference value to distinguish an input into high and low levels is caused to approach said predetermined value.

7. The voltage controlled oscillator as defined in claim 2, further comprising a driving circuit which is provided between said differential amplifier and switching elements included by said first to (n+1)th bypass circuits, and amplifies a current outputted by said amplifier.

8. The voltage controlled oscillator as defined in claim 7, wherein said driving circuit includes a pair of transistors which are complementary to each other and connected to each other in series, and are provided between said one of power lines and said other power line, and wherein said output of said differential amplifier is inputted to a control electrode of one of said pair of transistors in such a manner that said one of said pair of transistors is turned off when said potential difference exceeds said predetermined value, a control electrode of the other of said pair of transistors is connected to said one of power lines or said other power line in such a manner that said other of said pair of transistors is always turned on, and a connecting portion of said pair of transistors is connected to said switching element.

9. The voltage controlled oscillator as defined in claim 7, wherein said driving circuit includes a serial circuit formed by a transistor and a resistive element, said serial circuit being provided between said one of power lines and said other power line, and wherein said output of said differential amplifier is inputted to a control electrode of said transistor, and the connecting portion of said transistor and said resistive element is connected to said switching element.

10. The voltage controlled oscillator as defined in claim 1, referring to said first to (n+1)th current sources as a first group and referring to said control signal as a first control signal, further comprising a second group of first to (n+1)th current sources which have the same structures, are provided between said one of power lines and said other power input ends of said first to (n+1)th inverters respectively, and supply a current having a magnitude that corresponds to a second control signal, wherein said current control circuit supplies said first and second control signals respectively to said first and second groups of current sources in response to said input voltage signal in such a manner that the magnitudes of currents supplied from said second group of current sources are greater than those of currents supplied from said first group of current sources.

11. The voltage controlled oscillator as defined in claim 10, wherein each of said first to (n+1)th current sources which belong to said first group includes a first MOS transistor element for receiving said first control signal at a gate electrode, each of said first to (n+1)th current sources which belong to said second group includes a second MOS transistor element for receiving said second control signal at a gate electrode, and a channel width of said second MOS transistor element is set greater than a channel width equivalent in current to said first MOS transistor element.

12. The voltage controlled oscillator as defined in claim 10, wherein each of said first to (n+1)th current sources which belong to said first group includes a first MOS transistor element for receiving said first control signal at a gate electrode, each of said first to (n+1)th current sources which belong to said second group includes a second MOS transistor element for receiving said second control signal at a gate electrode, said second MOS transistor element includes a plurality of third MOS transistor elements having gate electrodes, drain electrodes and source electrodes connected to one another, and a channel width of each of said third MOS transistor elements is set equal to a channel width equivalent in current to said first MOS transistor element.

13. The voltage controlled oscillator as defined in claim 1, wherein said one of power lines and said other power input ends of said first to (n+1)th inverters are connected to each other through a resistive element.

14. The voltage controlled oscillator as defined in claim 1, wherein said one of power lines and said other power input ends of said first to (n+1)th inverters are short-circuited.

15. The voltage controlled oscillator as defined in claim 1, wherein said source current ratio is set within a range in which an output of each of said first to (n+1)th inverters can reach a level on a potential side of said other power line.

16. The voltage controlled oscillator as defined in claim 15, wherein said source current ratio b is set within a range in which a relationship of $Tmax \leq (k+1) Vt/\theta + kaVt/(b\theta)$ is established for a transition time Tmax and a transition speed $\theta$ taken during a transition of an output of each of said first to (n+1)th inverters from a first level on a potential side of said one of power lines to a second level on a potential side of said other power line, a potential difference Vt between a threshold voltage of each of said first to (n+1)th inverters and said first level, a potential difference aVt between said threshold voltage and said second level, said source current ratio b, and a natural number k defined by n=2k+1.

* * * * *